United States Patent [19]
Gotro et al.

[11] Patent Number: 5,827,907
[45] Date of Patent: Oct. 27, 1998

[54] HOMO-, CO- OR MULTICOMPONENT THERMOPLASTIC POLYMER DISPERSED IN A THERMOSET RESIN

[75] Inventors: Jeffrey Thomas Gotro, Endwell; Jeffrey Curtis Hedrick, Peekskill; Konstantinos Papathomas, Endicott; Niranjan Mohanlal Patel, Wappingers Falls; Alfred Viehbeck, Fishkill, all of N.Y.; William Joseph, Minneapolis, Minn.

[73] Assignee: IBM Corporation, Armonk, N.Y.

[21] Appl. No.: 114,419

[22] Filed: Aug. 30, 1993

[51] Int. Cl.$^6$ .......................... C08K 9/00; C08F 283/00; C08G 65/48

[52] U.S. Cl. .......................... 523/206; 523/208; 523/222; 523/423; 523/424; 523/444; 523/457; 525/92 K; 525/92 L; 525/391; 525/395; 525/396; 525/397; 525/471; 525/523; 525/533; 525/534; 525/537; 525/538; 525/905; 525/906

[58] Field of Search .......................... 525/471, 523, 525/533, 534, 537, 538, 903, 905, 906, 92 K, 92 L, 391, 395, 396, 397; 523/206, 208, 222, 423, 424, 444, 457

[56] References Cited

U.S. PATENT DOCUMENTS

| 3,622,541 | 11/1971 | Darsow et al. | 528/125 |
|---|---|---|---|
| 4,045,408 | 8/1977 | Griffith et al. | 528/102 |
| 4,222,918 | 9/1980 | Zentner et al. | 525/523 |
| 4,339,565 | 7/1982 | Tomoda | 528/27 |
| 4,496,695 | 1/1985 | Sugio et al. | 525/391 |
| 4,663,401 | 5/1987 | Saito et al. | 525/523 |
| 4,822,832 | 4/1989 | Chu et al. | 523/423 |
| 4,876,298 | 10/1989 | Itoh et al. | 525/531 |
| 4,891,417 | 1/1990 | Re et al. | 528/112 |
| 4,916,202 | 4/1990 | Butler et al. | 528/98 |
| 4,959,426 | 9/1990 | Re et al. | 525/527 |
| 5,008,135 | 4/1991 | Giordano et al. | 525/113 |
| 5,043,367 | 8/1991 | Hallgren et al. | 523/429 |
| 5,075,378 | 12/1991 | Smierciak et al. | 525/113 |
| 5,114,780 | 5/1992 | Mercer et al. | 428/195 |
| 5,155,175 | 10/1992 | Mercer et al. | 525/390 |
| 5,204,416 | 4/1993 | Mercer et al. | 525/390 |
| 5,548,034 | 8/1996 | Afzali-Ardakani et al. | 525/390 |

FOREIGN PATENT DOCUMENTS 388358   9/1990   European Pat. Off. .

*Primary Examiner*—Randy Gulakowski
*Attorney, Agent, or Firm*—Thomas A. Beck

[57] ABSTRACT

A composition having enhanced fracture resistance comprising a heat curable reaction product of a fluorine-containing thermoset material and a fluorine-containing homopolymer, wherein the cured reaction product comprises the thermoset material having a plurality of discrete phases of said fluorine-containing homopolymer dispersed therein, the homopolymer phases being in the range of micron to sub-micron size.

34 Claims, 3 Drawing Sheets

HOMO-, CO- OR MULTICOMPONENT THERMOPLASTIC POLYMER DISPERSED IN A THERMOSET RESIN

BACKGROUND OF THE INVENTION

1. Technical Field of the Invention

The present invention relates to a curable thermosetting resin composition having enhanced fracture toughness as a result of the incorporation of reactive thermoplastic oligomers therein. More specifically, the present invention relates to a composition comprising a thermoset resin which contains fluorine and containing at least one fluorine containing thermoplastic homopolymer component which is soluble in the thermoset. Said thermoplastic polymer undergoes an in-situ phase separation process during cure to form a microphase separated multiphase thermoset material.

Furthermore, the present invention relates to a composition comprising a thermoset resin which optionally contains (i.e., it may or may not contain) fluorine, bromine or both and containing at least one thermoplastic co-, ter- or multi-component polymer component which is fluorine-containing and is soluble in the thermoset. Said thermoplastic polymer undergoes an in-situ phase separation process during cure to form a microphase-separated multiphase thermoset material.

Furthermore, this invention relates to a composition comprising a thermoset resin which may or may not contain fluorine, bromine or both and containing at least one bromine-containing homo- or multicomponent thermoplastic polymer modifier optionally containing a different halogen which is soluble in the thermoset. Said thermoplastic polymer undergoes an in-situ phase separation process during cure to form a microphase-separated multiphase thermoset material.

The resin composition may be impregnated into various types of reinforcement, yielding insulating materials with either a controlled coefficient of thermal expansion (CTE) or a low dielectric constant or both.

Furthermore, this invention relates to a curable material useful in conducting heat or electricity comprising a thermosetting material and inorganic or metal particles which exhibit high thermal stability with controlled CTE.

Furthermore, the present invention relates to a curable material useful in the fabrication of prepreg layers for use in the manufacture of articles related to electronic packaging structures, aircraft, aerospace, automotive, recreational articles, and as adhesives.

Furthermore, the present invention relates to a curable material for use in electronic packaging applications wherein a thermoset material is required which has high fracture toughness and improved mechanical performance and is processable with existing manufacturing technology.

More particularly, this invention relates to a modified thermosetting material useful in the fabrication of printed circuit boards, semiconductor chip carriers, metal-core boards, reaction injection molded (RIM) cards, multichip modules, and multilayer thin film circuit structures, which may include more than one conductive layer and may incorporate electrical interconnections including through-holes or vias between two or more conductive layers or blind vias between two layers. This invention is well suited for use as a substrate material for surface mounted electronic components.

In addition, this invention relates to an improved material and printed circuit board made therefrom comprising a modified thermosetting material and reinforcement which exhibits high thermal stability, flame retardant characteristics and a controlled CTE.

2. Prior Art

Halogenated based thermosetting resins possess a number of attractive properties such as low dielectric constants, excellent thermal stability, low moisture uptake, high glass transition temperature, and good melt or solution processability characteristics.

Other attractive properties of these thermosetting resins include, methyl ethyl ketone (MEK) solubility, no volatile formation upon curing, outstanding adhesive properties, and photoimageability, (if desired).

However, use of these thermosetting materials in electronic packaging applications (e.g., prepregs, laminates, circuit boards) is limited due to their brittle nature which makes them susceptible to cracking when stressed or during processing such as via formation by, for example, drilling. This inherent brittleness is due to the high crosslink density of the networks which results in poor fracture toughness. Although there have been significant efforts to enhance the fracture toughness of the aforementioned thermosetting resins, further improvement in the mechanical properties of these materials is required in order to make them useful in electronic packaging applications. (As used herein, "fracture toughness" is a measure of how much energy is needed to propagate a crack in the plastic.)

U.S. Pat. No. 5,026,789 to Weber et al. and the publication by Weber et al., "Highly Damage Tolerant Carbon Fiber Epoxy Composites for Primary Aircraft Structural Applications", SAMPE Quarterly, 21(1), 46–51 (1989), describe the use of reactive poly(ether sulfone)s to enhance the toughness of epoxy resin thermosets. The structures of the epoxy resins and thermoplastic described in the patent are different from those in the present invention. The present invention describes halogenated materials which are MEK soluble/processable for electronic applications. Weber et al. do not discuss the incorporation of halogen-containing compounds to enhance compatibility/solubility characteristics.

U.S. Pat. Nos. 4,853,423, 4,975,319 and 5,096,771 all to Walles et al. describe a curable composition containing at least one bisphenol polyglycidyl ether, at least one epoxidized novolak and at least one brominated bisphenol in combination with polyphenylene ether. Thus these references also disclose a composition containing epoxy resin and a thermoplastic. The work by Walles et al. describes the incorporation of polyphenylene into brominated epoxy resins. The present invention describes the incorporation of a carefully designed halogenated poly(arylene ether) thermoplastic into thermosetting resins for improved mechanical properties. The system described by Walles et al. is not MEK processable and does not possess the enhanced mechanical properties as observed in the present invention.

U.S. Pat. Nos. 5,043,367, 5,073,605 and 5,108,842 all to Hallgren et al. describe a curable composition containing at least one bisphenol polyglycidyl ether, at least one epoxidized novolak and at least one brominated bisphenol in combination with polyphenylene ether. The work described by Hallgren et al. is analogous to that of Walles et al. noted above except that different catalysts/accelerators were evaluated. Hallgren et al. describe the incorporation of polyphenylene into brominated epoxy resins. The present invention describes the incorporation of a carefully designed halogenated poly(arylene ether) thermoplastic into thermosetting resins for improved mechanical properties. The system described by Hallgren et al. is not MEK prossessable and does not possess the enhanced mechanical properties as observed in the present invention.

U.S. Pat. Nos. 4,656,208, 4,822,832 and EP 0,193,082 to Chu et al. disclose the use of amine terminated poly(ether sulfone)s to enhance the toughness of epoxy resin thermosets. The structures of the epoxy resins and thermoplastic described in the patent are difference than those in the present invention. The present invention describes the incorporation of a carefully designed halogenated poly(arylene ether) thermoplastic into thermosetting resins for improved mechanical properties. The Chu et al. patent does not discuss the incorporation of halogen compounds to enhance compatibility/solubility characteristic.

J. E. McGrath et al., "Chemical Modification of Matrix Resin Networks with Engineering Thermoplastics", Polymer Bulletin, 13, 201–208 (1985) discloses the incorporation of hydroxyl terminated poly(ether sulfone)s to enhance the toughness of epoxy resin thermosets. The structures of the epoxy resins and thermoplastic described in the publication are different than those in the present invention. McGrath et al. describe the thermoplastic modification of simple diglycidyl ether of bisphenol A (DGEBA) based epoxy resins. The present invention describes halogenated poly(arlyene ether) thermoplastics which are MEK soluble/processable for electronic applications. McGrath et al. do not discuss the incorporation of halogen compounds to enhance compatibility/solubility characteristics.

G. R. Almen et al., "Semi-IPN Matrix Systems for Composite Aircraft Primary Structures", 33rd International SAMPE Symposium, Mar. 7–10, 1988, pp. 979–989, deals with the incorporation of a "polyaromatic thermoplastic" to improve the toughness of epoxy resin thermosets. The structures of the epoxy resins and thermoplastic described in the publication are different than those in the present invention. Almen et al. do not discuss the incorporation of halogen compounds to enhance compatibility/solubility characteristics.

As the prior art cited above discloses, poly(arylene ether)s have been repeatedly claimed in the prior art as modifiers for epoxy resins to enhance mechanical properties. However, after a review of the prior art with respect to the present invention, there are key distinctions not addressed by the prior art.

SUMMARY OF THE INVENTION

One aspect of the present invention comprises a novel modified fluorine-containing thermoset material selected from the group consisting of epoxy resin, benzocyclobutene, bismaleimide, acetylene-terminated resins, propargyl, bisnadimides, bismaleimide-triazine-epoxy blends, and blends thereof possessing enhanced fracture toughness and improved drillability. The modifiers suitable for use are tough, ductile fluorine-containing poly(arylene ether) engineering thermoplastics possessing relatively high glass transition temperatures ($T_g$) (i.e., between about 140° C. and 240° C.) which when combined with the fluorine-containing thermoset network do not reduce high temperature stability. The materials can be processed with conventional manufacturing techniques.

The present invention improves the fracture toughness of fluorine-containing thermosetting material selected from the group above. It involves the incorporation of specifically tailored thermoplastic polymers into a thermoset network.

A custom synthesized (non-commercial) thermoplastic modifier is used which is highly compatible with the fluorine-containing thermosetting resin. The high degree of compatibility was achieved by incorporating fluorine into the backbone of the poly(arylene ether) thermoplastic. High compatibility is essential to achieve microphase separation and improved mechanical properties. Indeed, enhanced fracture toughness is directly related to the morphology (i.e., phase separation characteristics).

The fluorine-containing thermoplastic modifier utilized to toughen the fluorine-containing thermosetting resin is methyl ethyl ketone (MEK) soluble. This is unique because high $T_g$ engineering thermoplastics are typically only soluble in polar aprotic solvents such as N-methyl-2-pyrrolidinone, dimethylacetamide, etc. or chlorinated solvents such as chloroform, methylene chloride, etc. which are unacceptable in manufacturing of many electronic articles. MEK solubility is designed into the thermoplastic by the incorporation of fluorine on to the backbone of the thermoplastic modifier.

The fluorine-containing thermoplastic modifier is inherently flame retardant so it can be incorporated into inherently flame retardant fluorine-containing thermosetting resins and this property can be maintained without the addition of flame retardant agents.

In summary, the fluorine-containing thermoplastic modified thermosetting resin system described herein specifically addresses the needs of the electronic industry for applications as matrix resins in circuit board and card technologies. The present invention describes for the first time a MEK processable, high $T_g$ thermoplastic modifier for fluorine-containing thermosetting resins from the group selected above.

This invention provides the design and synthetic procedure for a fluorine-containing thermoplastic polymer which can be co-reacted with the fluorine-containing thermosetting resins to enhance fracture toughness, processability, and drillability without sacrificing other desirable properties such as high temperature performance, thermal stability, etc. A requirement for the fluorine-containing thermoplastic polymers is that they be initially soluble in the fluorine-containing thermosetting resin melt and then undergo an in-situ phase separation process as the network cure progresses. Furthermore, the thermoplastic modifier must be soluble in methyl ethyl ketone (MEK) for conventional processing techniques to be utilized to fabricate the electronic articles. This approach to a thermoplastic modifier would permit use of the existing resin and panel fabrication process but enhance the material mechanical properties for improved processability and product reliability.

When the crosslinking reaction is complete, the final composition contains fluorine-containing thermoset with thermoplastic phases on the submicron scale which it is believed, results in the substantial increase in fracture toughness. If a prepolymer is used, the reaction proceeds in the same manner. Optionally, by blending different miscible thermosetting monomers such as one having low $T_g$, and one having high $T_g$ an intermediate $T_g$ material is formed which maintains the physical properties of the high $T_g$ material, such as the desired fracture toughness.

The fluorine-containing thermoset resin structures embodied within the scope of the present invention are:

wherein X is a epoxide, maleimide, nadimide, propargyl, acetylene, or benzocyclobutene; and wherein R is an aliphatic or aromatic moiety or group of chemical substituents containing fluorine.

The fluorine-containing thermoplastic homo-polymers used as modifiers in accordance with the present invention possess a repeating structural element of the formula (I)

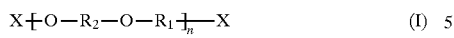 (I)

wherein X is any group capable of reacting with an amine, epoxide, nadimide, maleimide, acetylene, propargyl, benzocyclobutene; and n is 1 to 100.

The group $R_1$, represents bivalent aromatic groups of the formulas (IIa) to (IIe)

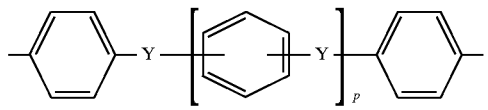 (IIa)

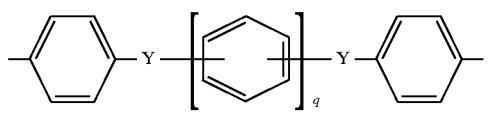 (IIb)

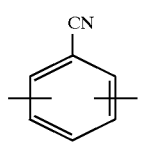 (IIc)

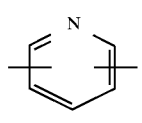 (IId)

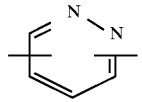 (IIe)

wherein Y represents —CO—, —S—, —SO— or —SO$_2$—, —PO(C6H5)—, p signifies the number 0, 1 or 2 and q is the number 2 or 3, $R_2$ signifies a bivalent aromatic group of the formulas (IIIa)–(IIIr)

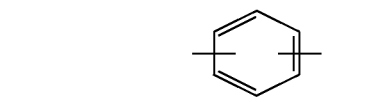 (IIIa)

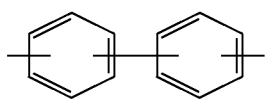 (IIIb)

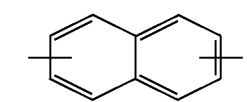 (IIIc)

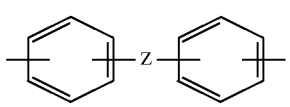 (IIId)

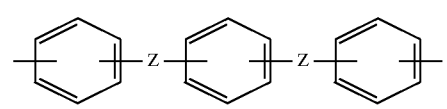 (IIIe)

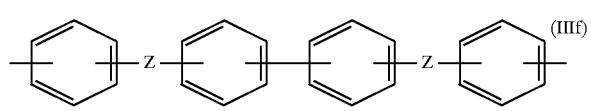 (IIIf)

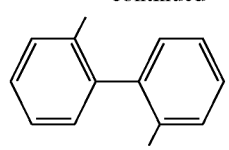 (IIIg)

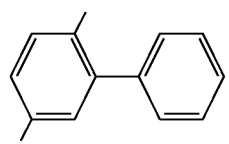 (IIIh)

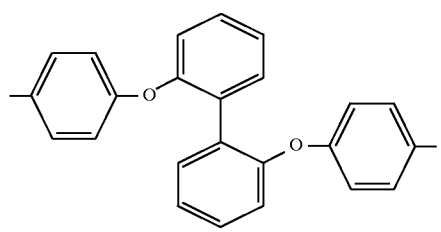 (IIIi)

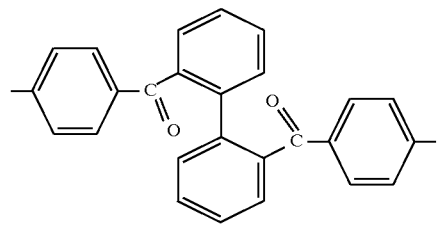 (IIIj)

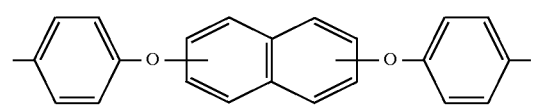 (IIIk)

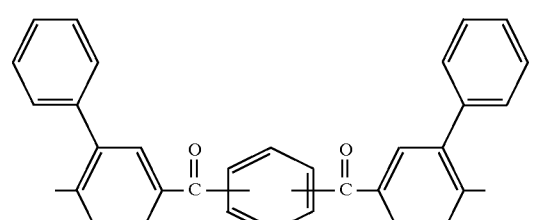 (IIIl)

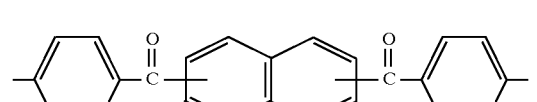 (IIIm)

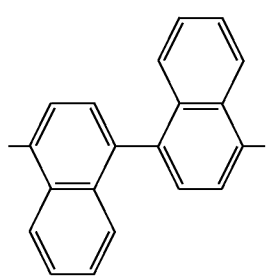 (IIIn)

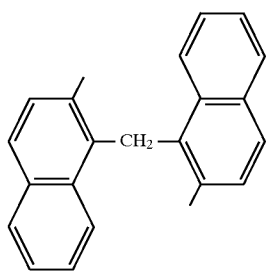 (IIIo)

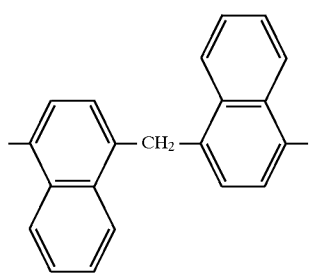 (IIIp)

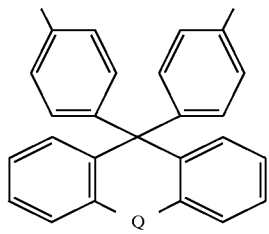 (IIIq)

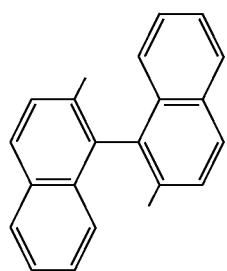 (IIIr)

wherein Q represents a direct bond, —CH₂—, —O— or —CO—, and Z represents —CH₂—, —C(CH₃)₂—, —C(CH₃)(C₆H₅)—, —CH(CH₃)—, —C(CF₃)(C₆H₅)—, —C(CF₃)₂—, —S—, —O—, —PO(C₆H₅)—, —SO₂— or —CO— and wherein the aromatic rings of the formulas (IIa)–(IIe) are unsubstituted or are substituted by one or more halogen atoms and/or (C₁–C₅) alkyl groups which may be fluorine-containing or (C₁–C₅) alkoxy groups which may be fluorine-containing and wherein the aromatic rings of the formulas (IIIa)–(IIIr) are unsubstituted or are substituted by one or more halogen atoms and/or (C₁–C₅) alkyl groups or (C₁–C₅) alkoxy groups which may contain fluorine.

Examples of such alkyl groups are methyl, ethyl, n-propyl, isopropyl, n-butyl, sec-butyl or tert-butyl.

Examples of alkoxy groups are methoxy, ethoxy, n-propoxy, isopropoxy, n-butoxy or tert-butoxy.

R₁ in formula (I) advanatgeously represents

R₂ in formula (I) preferably represents

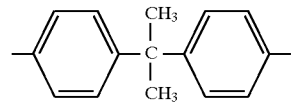

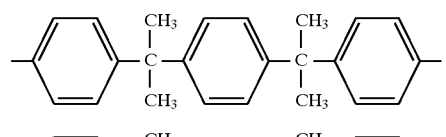

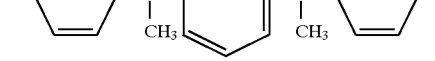

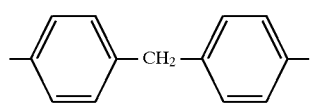

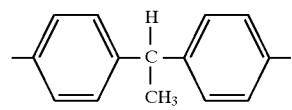

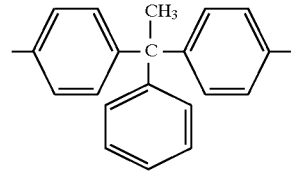

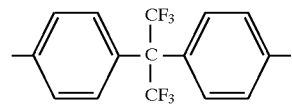

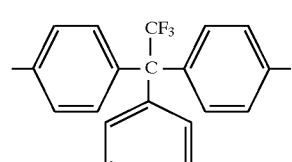

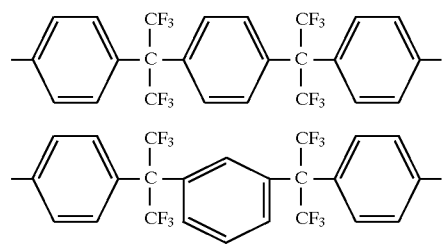

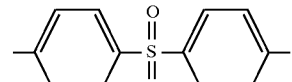

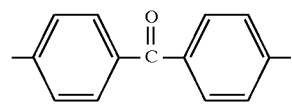

-continued

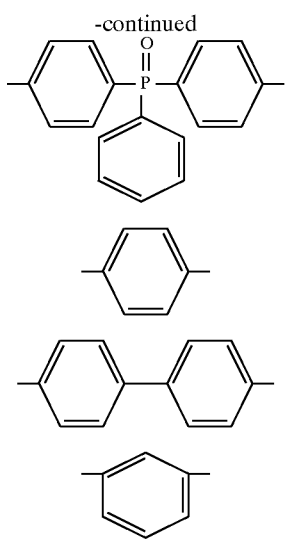

wherein the aromatic rings are unsubstituted or substituted by one or more halogen atoms and/or ($C_1$–$C_5$) alkyl groups which may contain fluorine or ($C_1$–$C_5$) alkoxy groups which may contain fluorine.

In especially preferred components of the fluorine-containing thermoplastic homopolymers, $R_2$ represents a group of the formula

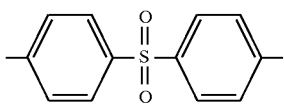

and $R_2$ preferably represents a group of the formula

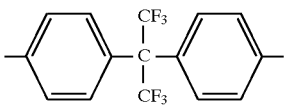

The fluorine-containing moieties or groups of chemical substituents of the thermoplastic homopolymer provide compatibility and initial solubility in the fluorine-containing thermosetting resin (before cure) and impart MEK solubility to the thermoplastic modifier.

As previously noted, in the reaction used to form the network, the fluorine-containing thermosetting resin initially acts as a solvent for the fluorine-containing thermoplastic modifier.

As the fluorine-containing thermosetting resin becomes highly branched and crosslinked, thermoplastic homopolymer chains start forming domains as driven by thermodynamic principles as the reaction proceeds substantially to completion.

At the end of the reaction, these domains have grown into phases of microscopic sizes (angstroms to microns) rich in thermoplastic homopolymer surrounded by a highly crosslinked matrix of the fluorine-containing thermoset resin network.

Useful features which have been designed into the aforementioned system include:

1. The fluorine-containing thermoplastic homopolymer used is initially soluble in the fluorine-containing thermosetting resin at a temperature of approximately 20° C. above the melting point of the resin. This fluorine-containing thermoplastic undergoes an in-situ phase separation process during network formation to form a microphase separated multiphase network. To achieve these criteria, the backbone structure of the fluorine-containing thermoplastic homopolymer is selected and designed with the intent of maximizing compatibility.

2. Methyl ethyl ketone solubility of the fluorine-containing thermoplastic homopolymer makes this a system which is compatible with industrial environmental requirements. This is essential so that this material can be processed with the existing technologies currently utilized in the fabrication of printed circuit boards. Typically, high $T_g$ fluorine-containing thermoplastics of this type are only soluble in polar aprotic solvents or chlorinated solvents which are not environmentally acceptable.

3. The introduction of reactive functional groups on the terminal ends of the thermoplastic homopolymer modifier is especially beneficial. This allows the fluorine-containing thermoplastic to be chemically incorporated (covalently bonded) into the network structure. Chemical incorporation enhances the compatibility of the modifier and results in a more uniform morphology. It also insures that solvent resistance in the cured network is maintained.

4. Molecular weight control of the fluorine-containing thermoplastic homopolymer modifier is provided. The solubility, morphology, modulus, and fracture toughness of the modified fluorine-containing thermosetting resins are a function of the molecular weight of the fluorine-containing thermoplastic modifier. Typically, the optimum molecular weight is in the range of 5,000 to 21,000 g/mol. This molecular weight range is just above the critical molecular weight for entanglements for these polymers. If melt processability is desired, lower molecular weights (2,500 to 13,000 g/mol) may be required to reduce the melt viscosity.

5. Optimal composition of the fluorine-containing thermoplastic homo-polymer modifier in the fluorine-containing thermosetting resin ranges between 5 to 40 weight/weight percent. The resulting properties such as fracture toughness, morphology, modulus, dielectric constant, etc. are all a function of chemical nature of the fluorine-containing thermoplastic modifier which has been designed in this case to provide improved mechanical performance without sacrificing the desirable properties of the thermoset material.

6. The backbone structures of the thermoplastic homopolymer modifiers are tailored to reduce their dielectric constants. This is achieved by the incorporation of fluorine-containing moieties or groups of chemical substituents in the backbone of the polymer.

Another aspect of the present invention comprises a novel modified thermoset material selected from the group consisting of epoxy resin, benzocyclobutene, bismaleimide, acetylene-terminated resins, propargyl, bisnadimides, bismaleimide-triazine-epoxy blends, cyanate resins and blends thereof possessing enhanced fracture toughness and improved handling and drillability. The modifiers suitable for use are tough, ductile multicomponent fluorine-containing poly(arylene ether) engineering thermoplastics possessing relatively high glass transition temperatures ($T_g$) (i.e., between about 140° C. and 240° C.) which when combined with the thermoset network do not reduce high temperature stability. The materials can be processed with conventional manufacturing techniques.

The present invention improves the fracture toughness of thermoset materials which optionally contain fluorine selected from the group above. It involves the incorporation of specifically tailored fluorine-containing thermoplastic multicomponent polymers into a thermoset network.

A custom synthesized (non-commercial) fluorine-containing thermoplastic modifier is used which is highly compatible with the thermoset resin. The high degree of compatibility was achieved by using an appropriate multicomponent polymer structure of the fluorine-containing poly (arylene ether) thermoplastic. As used herein, the expression "multicomponent polymer" shall refer to thermoplastic modifier polymers used in accordance with the present invention comprising two, three, four or more repeat units. High compatibility is essential to achieve microphase separation and improved mechanical properties. Indeed, enhanced fracture toughness is directly related to the morphology (i.e., phase separation characteristics).

The multicomponent thermoplastic modifier utilized to toughen the thermosetting resin is methyl ethyl ketone (MEK) soluble. This is unique because high $T_g$ engineering thermoplastics are typically only soluble in polar aprotic solvents such as N-methyl-2-pyrrolidinone, dimethylacetamide, etc. or chlorinated solvents such as chloroform, methylene chloride, etc. which are unacceptable in manufacturing many of electronic articles. MEK solubility was designed into the thermoplastic by the incorporation of fluorine on to the backbone of the thermoplastic modifier.

In summary, the multicomponent thermoplastic modified thermosetting resin system described herein specifically addresses the needs of the electronic industry for applications as matrix resins in circuit board and card technologies. The present invention describes for the first time a MEK processable, high $T_g$ thermoplastic modifier for thermosetting resins from the group selected above.

This invention provides the design and synthetic procedure for a fluorine-containing thermoplastic multicomponent polymer which can be co-reacted with the thermosetting resins, which optionally contains fluorine, to enhance fracture toughness, processability, and drillability without sacrificing other desirable properties such as high temperature performance, thermal stability, etc. A requirement of the fluorine-containing thermoplastic multicomponent polymer is that it be initially soluble in the thermosetting resin melt and then undergo an in-situ phase separation process as the network cure progresses. Furthermore, the multicomponent fluorine-containing thermoplastic modifier must be soluble in methyl ethyl ketone (MEK) for conventional processing techniques to be utilized to fabricate the electronic articles. This approach to a thermoplastic modifier would permit use of the existing resin and panel fabrication process but enhance the material mechanical properties for improved processability and product reliability.

When the crosslinking reaction is complete, the final composition contains a thermoset matrix with discrete thermoplastic phases on the submicron scale which it is believed, results in the substantial increase in fracture toughness. If a prepolymer is used, the reaction proceeds in the same manner. Optionally, by blending different miscible thermosetting monomers such as one having low $T_g$, and one having high $T_g$ an intermediate $T_g$ material is formed which maintains the physical properties of the high $T_g$ material, such as the desired fracture toughness.

The thermosetting resin structures embodied within the scope of the present invention are:

wherein X is an epoxide, maleimide, nadimide, propargyl acetylene, or benzocyclobutene; and wherein R is an aliphatic or aromatic moiety or group of chemical substituents which optionally may contain fluorine.

The multicomponent fluorine-containing thermoplastic modifiers used as modifiers in accordance with the present invention contains:

1–99 mol % of a repeating structural element of the formula (IV)

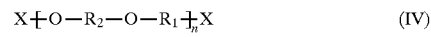   (IV)

and 99–1 mol % of a repeating structural element of the formula (V)

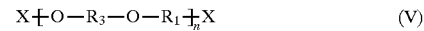   (V)

and 99–0 mol % of a repeating structural element of the formula (VI)

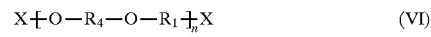   (VI)

wherein X is any group capable of reacting with an amine, epoxide, nadimide, maleimide, acetylene, propargyl, benzocylobutene; and n=1=100; and wherein $R_1$ represents bivalent aromatic groups of the formulas (VIIa) –(VIIe)

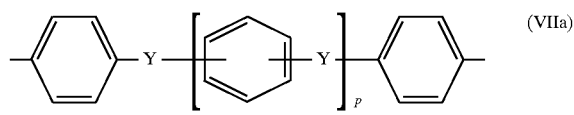   (VIIa)

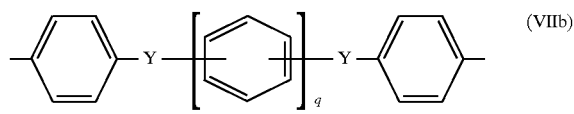   (VIIb)

   (VIIc)

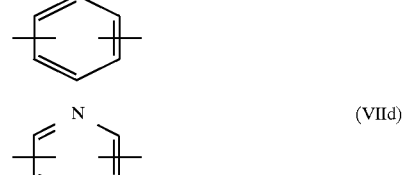   (VIId)

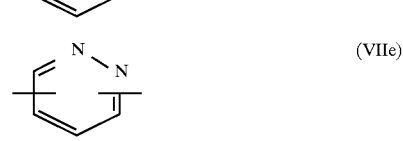   (VIIe)

wherein Y represents —CO—, —PO($C_6H_5$)—, —S—, —SO— or —$SO_2$—, p signify the number 0, or 2 and q is the number 2 or 3, $R_2$, $R_3$ and $R_4$ signifies a bivalent aromatic group of the formulas (VIIIa) to (VIIIr)

   (VIIIa)

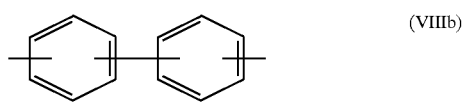   (VIIIb)

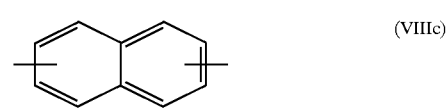   (VIIIc)

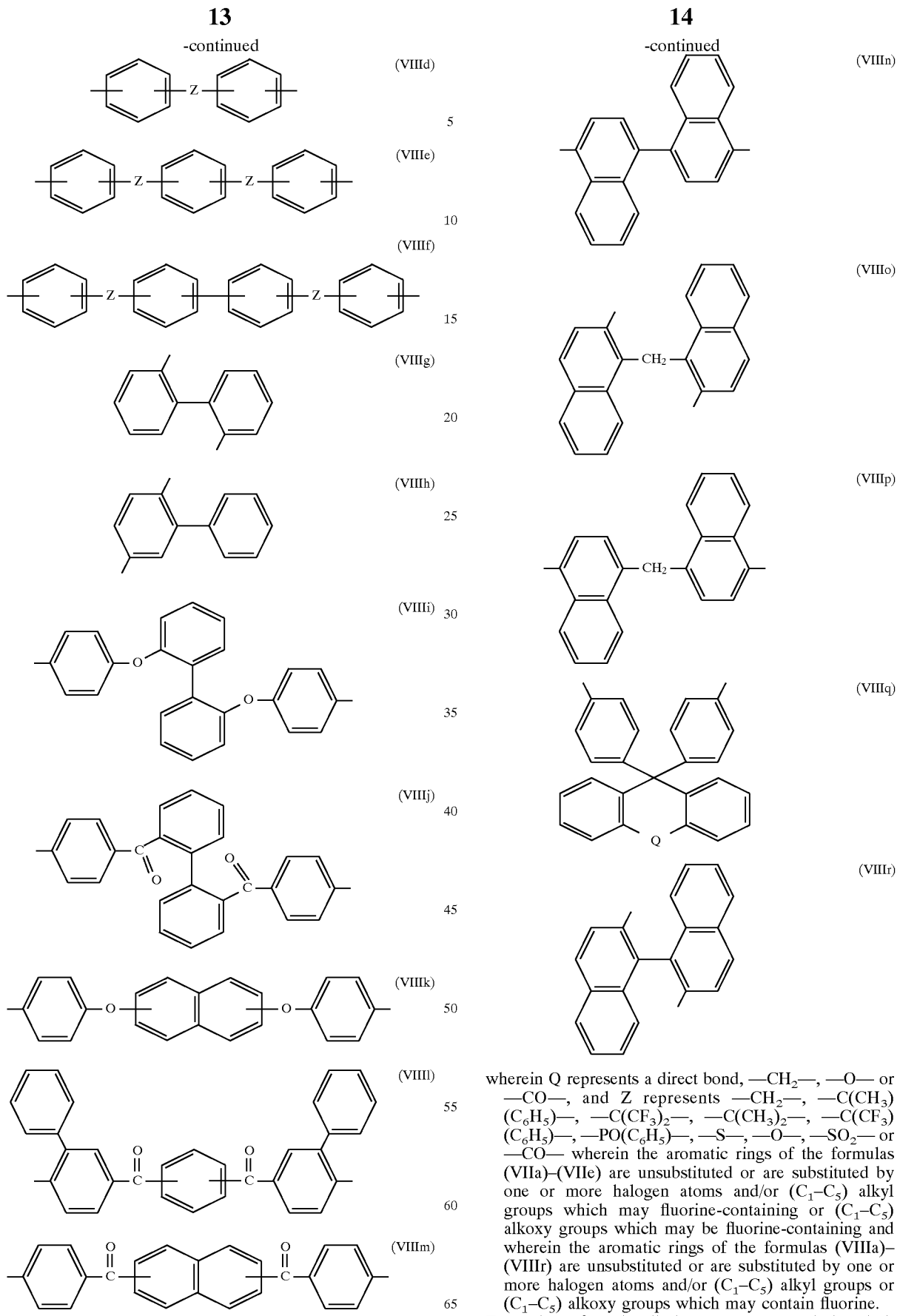

wherein Q represents a direct bond, —CH$_2$—, —O— or —CO—, and Z represents —CH$_2$—, —C(CH$_3$)(C$_6$H$_5$)—, —C(CF$_3$)$_2$—, —C(CH$_3$)$_2$—, —C(CF$_3$)(C$_6$H$_5$)—, —PO(C$_6$H$_5$)—, —S—, —O—, —SO$_2$— or —CO— wherein the aromatic rings of the formulas (VIIa)–(VIIe) are unsubstituted or are substituted by one or more halogen atoms and/or (C$_1$–C$_5$) alkyl groups which may fluorine-containing or (C$_1$–C$_5$) alkoxy groups which may be fluorine-containing and wherein the aromatic rings of the formulas (VIIIa)–(VIIIr) are unsubstituted or are substituted by one or more halogen atoms and/or (C$_1$–C$_5$) alkyl groups or (C$_1$–C$_5$) alkoxy groups which may contain fluorine.

Examples of such alkyl groups are methyl, ethyl, n-propyl, isopropyl, n-bntyl, sec-butyl or tert-butyl.

Examples of such alkyl groups are methoxy, ethoxy, ethoxy, n-propoxy, isopropoxy, n-butoxy or tert-butoxy.

$R_1$ in the formulas (IV), (V) and (VI) advantageously represents

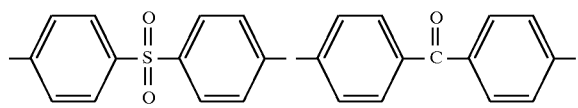

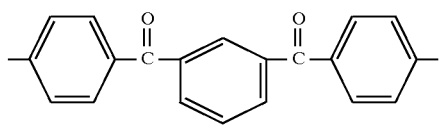

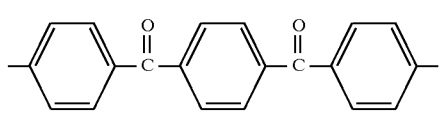

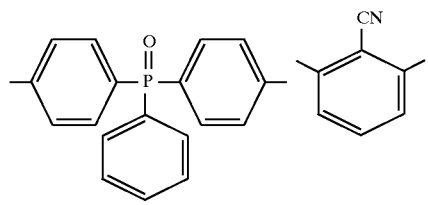

$R_2$, $R_3$, and $R_4$, in the formulas (IV), (V), (VII) preferably represent

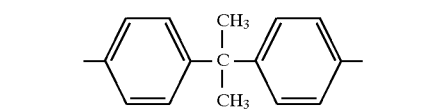

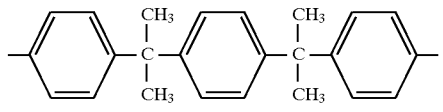

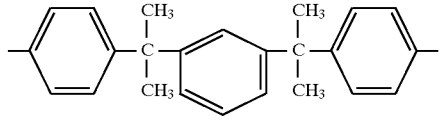

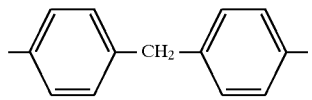

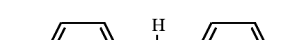

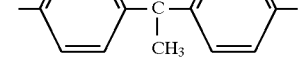

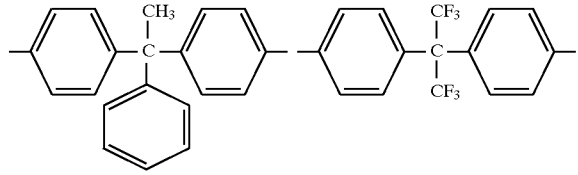

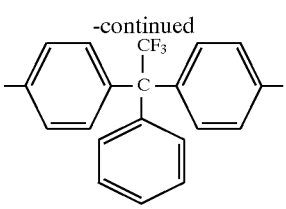

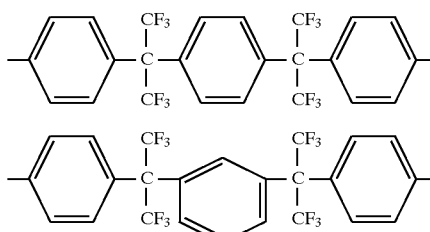

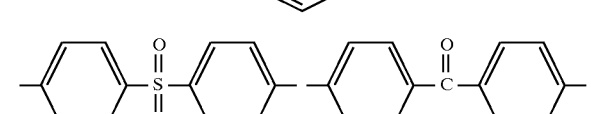

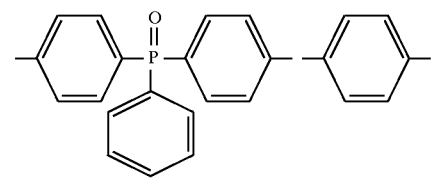

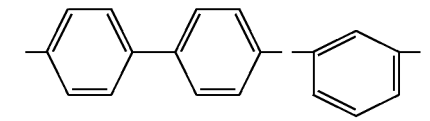

wherein the aromatic rings are unsubstituted or are substituted by one or more halogen atoms and/or ($C_1$–$C_5$) alkyl groups which may contain fluorine or ($C_1$–$C_5$) alkoxy groups which may contain fluorine.

In especially preferred components of the fluorine-containing thermoplastic multicomponent polymer, $R_1$ in particular represents a group of the formula

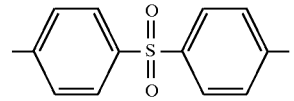

and in particular $R_2$ preferably represents a group of the formula

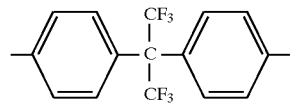

and in particular $R_3$ preferably represents a group of the formula

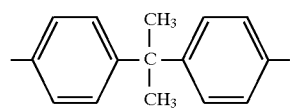

The fluorine-containing moieties or groups of chemical substituents of the thermoplastic multicomponent polymer provide compatibility and initial solubility in the thermosetting resin, which optionally contains fluorine, (before cure) and imparts MEK solubility to the thermoplastic modifier.

As previously noted, in the reaction used to form the network, the thermosetting resin, which optionally contains fluorine, initially acts as a solvent for the fluorine-containing thermoplastic multicomponent polymer.

As the thermosetting resin becomes highly branched and crosslinked, thermoplastic multicomponent polymer chains start forming domains as driven by thermodynamic principles as the reaction proceeds substantially to completion.

At the end of the reaction, these domains have grown into phases of microscopic sizes (angstroms to microns) rich in thermoplastic multicomponent polymer surrounded by a highly crosslinked matrix of the thermoset resin network.

Useful features which have been designed into the aforementioned system include:

1. The fluorine-containing thermoplastic multicomponent polymer used is initially soluble in the thermosetting resin which optionally contains fluorine at a temperature of approximately 20° C. above the melting point of the resin (100°–110° C.). This multicomponent thermoplastic undergoes an in-situ phase separation process during network formation to form a microphase separated multiphase network. To achieve these criteria, the backbone structure of the multicomponent thermoplastic modifier is selected and designed with the intent of maximizing compatibility.

2. Methyl ethyl ketone solubility of the multicomponent fluorine-containing thermoplastic makes this a system which is compatible with today's industrial environmental requirements. This is essential so that this material can be processed with the existing technologies currently utilized in the fabrication of printed circuit boards. Typically, high $T_g$ multicomponent thermoplastics of this type are only soluble in polar aprotic solvents or chlorinated solvents which are not environmentally acceptable.

3. The introduction of reactive functional groups on the terminal ends of the multicomponent fluorine-containing thermoplastic modifier is especially beneficial. This allows the multicomponent fluorine-containing thermoplastic to be chemically incorporated (covalently bonded) into the network structure. Chemical incorporation enhances the compatibility of the modifier and results in a more uniform morphology. It also insures that solvent resistance in the cured network is maintained.

4. Molecular weight control of the multicomponent fluorine-containing thermoplastic modifier is provided. The solubility, morphology, modulus, and fracture toughness of the modified thermosetting resins, which optimally contain fluorine, are a function of the molecular weight of the multicomponent thermoplastic modifier. Typically, the optimum molecular weight is in the range of 5,000 to 21,000 g/mol. This molecular weight range is just above the critical molecular weight for entanglements for these polymers. If melt processability is desired, lower molecular weights (2,500 to 13,000 g/mol) may be required to reduce the melt viscosity.

5. Optimal composition of the multicomponent fluorine-containing thermoplastic modifier in the thermosetting resin, which optionally contains fluorine, ranges between 5 to 40 weight/weight percent. The resulting properties such as fracture toughness, morphology, modulus, dielectric constant, etc. are all a function of chemical nature of the multicomponent fluorine-containing thermoplastic modifier which has been designed in this case to provide improved mechanical performance without sacrificing the desirable properties of the thermoset material.

Another aspect of the present invention comprises a novel modified bromine-containing thermoset material selected from the group consisting of epoxy resin, benzocyclobutene, bismaleimide, acetylene-terminated resins, propargyl, bisnadimides, bismaleimide-triazine-epoxy blends, cyanate resins and blends thereof; said thermoset optionally containing a different halogen. In addition these polymers possess enhanced fracture toughness and improved handling and drillability. The modifiers suitable for use are tough, ductile engineering thermoplastics possessing relatively high glass transition temperatures ($T_g$) (i.e., between about 140° C. and 240° C.) which when combined with the bromine-containing thermoset do not reduce high temperature stability. The materials can be processed with conventional manufacturing techniques.

The present invention improves the fracture toughness of bromine-containing thermoset materials selected from the group above. It involves the incorporation of specifically tailored thermoplastic polymers into a thermoset network.

Custom synthesized (non-commercial) bromine-containing thermoplastic modifier is used which is highly compatible with halogenated thermosetting resins. The high degree of compatibility was achieved by incorporating bromine on the backbone of the poly(arylene ether) homo- or multicomponent thermoplastic polymer. As used herein, "multicomponent polymer" refers to polymers comprising at least two or more different repeat units. High compatibility is essential to achieve microphase separation and improved mechanical properties. Indeed, enhanced fracture toughness is directly related to the morphology (i.e., phase separation characteristics).

The thermoplastic modifier utilized to toughen the halogenated thermosetting resin is methyl ethyl ketone (MEK) soluble. This is unique because high $T_g$ engineering thermoplastics are typically only soluble in polar aprotic solvents such as N-methyl-2-pyrrolidinone, dimethylacetamide, etc. or chlorinated solvents such as chloroform, methylene chloride, etc. which are unacceptable in manufacturing of many electronic articles. MEK solubility is designed into the thermoplastic by the incorporation of halogens on to the backbone of the thermoplastic modifier.

The bromine-containing thermoplastic modifier is inherently flame retardant so it can be incorporated inherently flame retardant halogenated resins and this property can be maintained without changing the thermosetting resin formulation.

In summary, the thermoplastic modified epoxy resin system described herein specifically addresses the needs of the electronic industry for applications as matrix resins in circuit board and card technologies. The present invention describes for the first time a MEK processable, high $T_g$ thermoplastic modifier for halogenated thermosetting resins.

This invention provides the design and synthetic procedure for a thermoplastic multicomponent polymer which can be co-reacted with bromine-containing thermosetting resins to enhance fracture toughness, processability, and drillability without sacrificing other desirable properties such as high temperature performance, thermal stability, etc. A requirement for the thermoplastic polymers is that they be initially soluble in the halogenated thermosetting resin melt and then undergo an in-situ phase separation process as the network cure progresses. Furthermore, the thermoplastic modifier must be soluble in methyl ethyl ketone for conventional processing techniques to be utilized to fabricate the electronic articles. This approach to a thermoplastic modifier would permit use of the existing resin and panel fabrication process but enhance the material mechanical properties for improved processability and product reliability.

When the crosslinking reaction is complete, the final composition contains halogenated thermoset matrix with discrete bromine-containing thermoplastic phases on the submicron scale which it is believed, result in the substantial increase in fracture toughness. If a prepolymer is used, the reaction proceeds in the same manner. Optionally, by blending different miscible thermosetting monomers such as one having low $T_g$, and one having high $T_g$ an intermediate $T_g$ material is formed which maintains the physical properties of the high $T_g$ material, such as the desired fracture toughness.

The bromine-containing thermoset resin structures embodied within the scope of the present invention are:

wherein X is an epoxide, maleimide, nadimide, amine, propargyl, acetylene, or benzochyclobutene; and wherein R is an aliphatic or aromatic moiety or group of chemical substituents containing bromine.

The multicomponent bromine-containing thermoplastic modifiers used as modifiers in accordance with the present invention has the repeating structural element containing 1–99 mol % of a repeating structural element of the formula (IX)

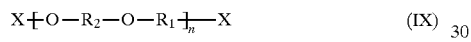 (IX)

and 99–1 mol % of a repeating structural element of the formula (X)

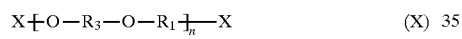 (X)

and 99–0 mol % of a repeating structural element of the formula (XI)

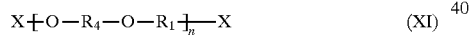 (XI)

wherein X is any group capable of reacting with an epoxide, nadimide, maleimide, acetylene, propargyl, benzocyclobutene; and n=1 to 100; and wherein $R_1$, represents bivalent aromatic groups of the formulas (XIIIa)–(XIIe)

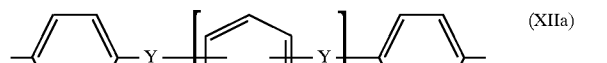 (XIIa)

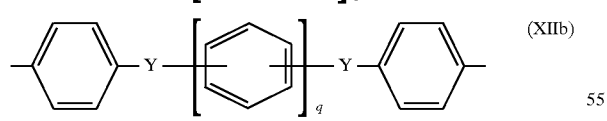 (XIIb)

 (XIIc)

 (XIId)

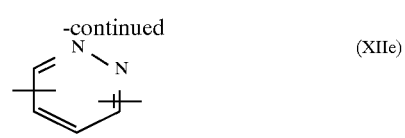 (XIIe)

wherein Y represents —CO—, —PO($C_6H_5$)—, —S—, —SO—, or $SO_2$—, p signifies the number 0, 1 or 2 and q is the number 2 or 3, $R_2$, $R_3$ and $R_4$ signify a bivalent aromatic group of the formulas (XIIIa) to (XIIIr)

 (XIIIa)

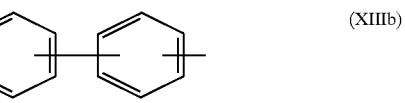 (XIIIb)

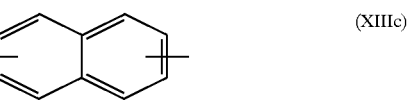 (XIIIc)

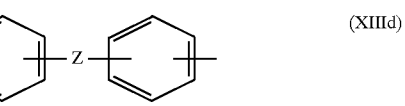 (XIIId)

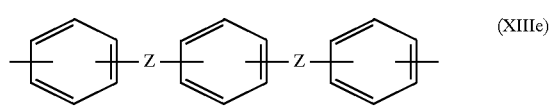 (XIIIe)

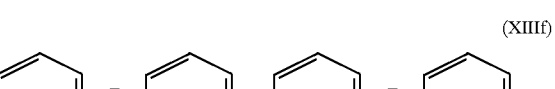 (XIIIf)

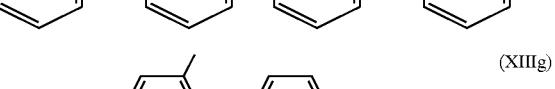 (XIIIg)

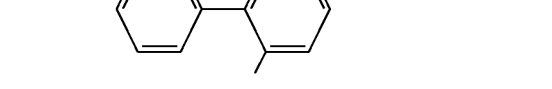 (XIIIh)

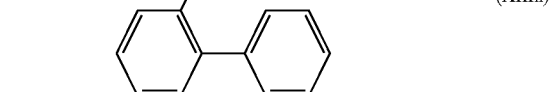 (XIIIi)

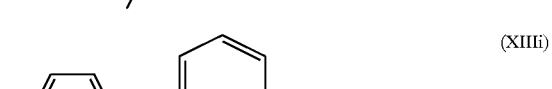 (XIIIj)

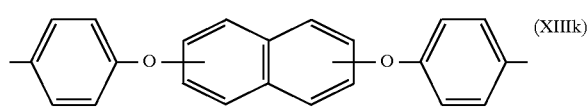 (XIIIk)

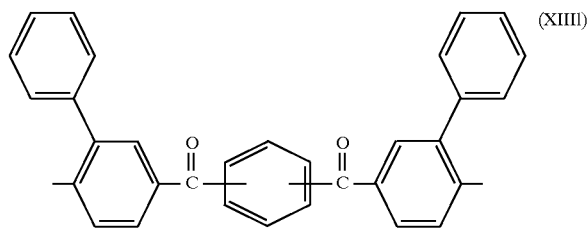 (XIIIl)

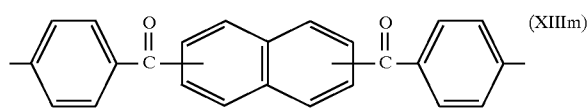 (XIIIm)

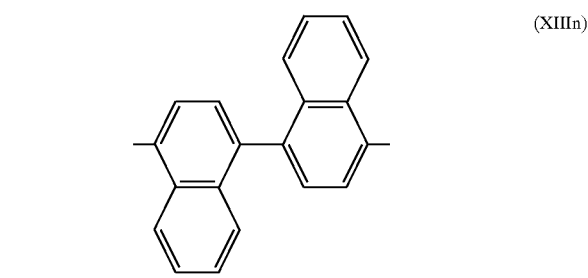 (XIIIn)

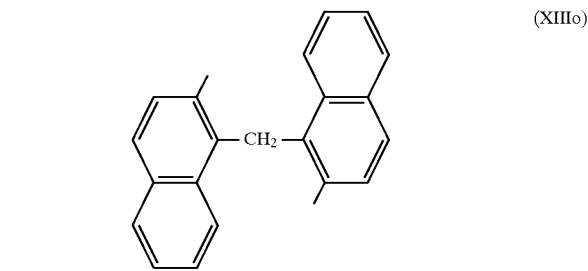 (XIIIo)

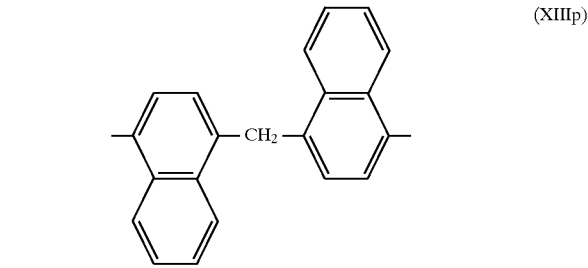 (XIIIp)

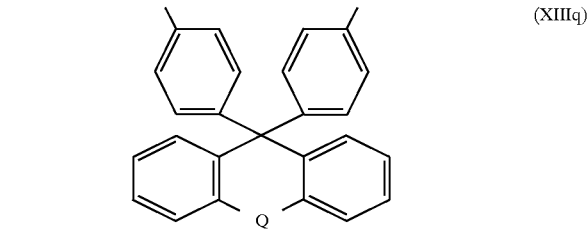 (XIIIq)

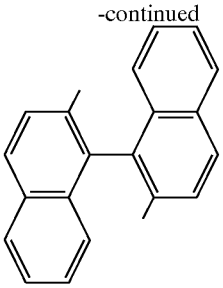 (XIIIr)

wherein Q represents a direct bond, —CH₂—, —O— or —CO— and Z represents —CH₂—, —C(CH₃)₂—, —C(CH₃)(C₆H₅)—, —C(CF₃)(C₆H₅)—, —C(CF₃)₂—, C(CH₃)₂—, —PO(C₆H₅)—, —S—, —O—, —SO₂— or —CO—, wherein the aromatic rings of the formulas (XIIa–(XIIe) are unsubstituted or are substituted by one or more halogen atoms and/or (C₁–C₅) alkyl groups which may be halogen-containing or (C₁–C₅) alkoxy groups which may be halogen-containing and wherein the aromatic rings of the formulas (XIIIa)–(XIIIr) are unsubstituted or are substituted by one or more halogen atoms and/or (C₁–C₅) alkyl groups or (C₁–C₅) alkoxy groups which may be halogen-containing.

Examples of such alkyl groups are methyl, ethyl, n-propyl, isopropyl, n-butyl, sec-butyl or tert-butyl.

Examples of alkoxy groups are methoxy, ethoxy, propoxy, isopropoxy, n-butoxy or tert-butoxy.

R₁ in the formulas (IX), (X) and (XI) advantageously represents

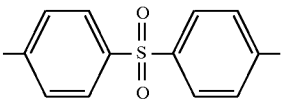

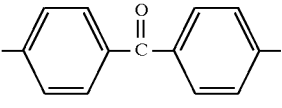

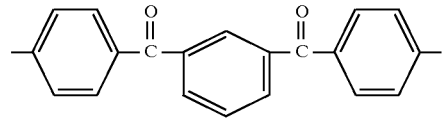

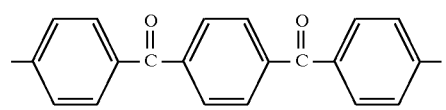

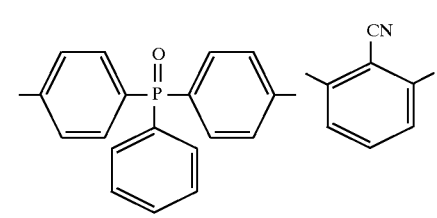

R₂, R₃ and R₄ in the formulas (IX), (X) and (XI) preferably represent

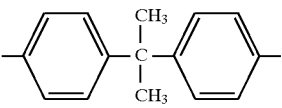

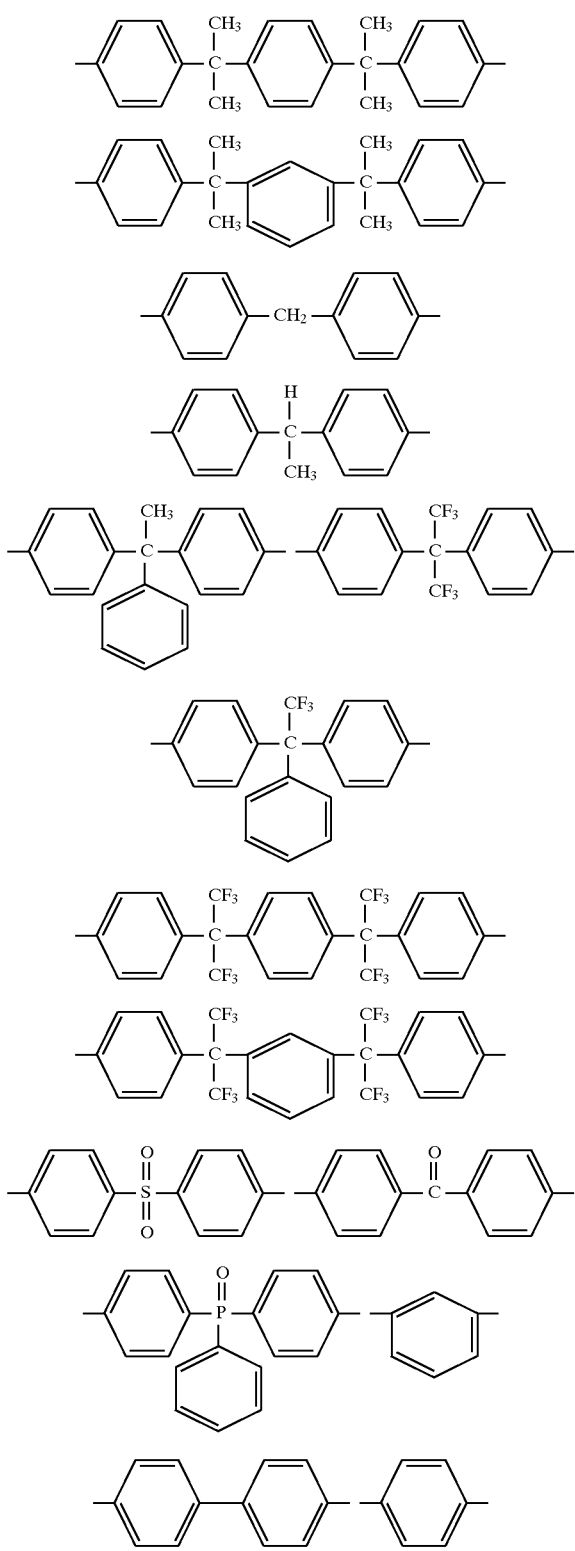

wherein the aromatic rings are unsubstituted or substituted by one or more halogen atoms and/or ($C_1$–$C_5$) alkyl groups which may contain bromine or ($C_1$–$C_5$) alkoxy groups which may contain bromine In especially preferred components of the bromine-containing thermoplastic multicomponent polymer, $R_1$ in particular represents a group of the formula

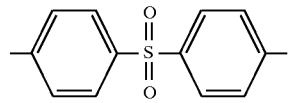

and in particular $R_2$ preferably represents a group of the formula

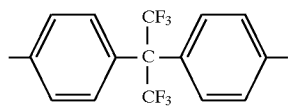

and in particular $R_3$ preferably represents a group of the formula

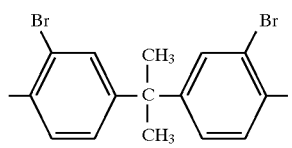

and in particular $R_4$ preferably represents a group of the formula

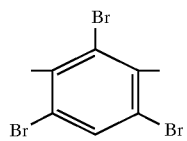

The bromine-containing moieties or groups of chemical substituents of the thermoplastic homo- or multicomponent polymers provide compatibility and initial solubility in the bromine-containing thermosetting resin (before cure) and impart MEK solubility to the thermoplastic modifier.

As previously noted, in the reaction used to form the network, the halogen-containing thermosetting resin initially acts as a solvent for the bromine-containing thermoplastic modifier.

As the bromine-containing thermosetting resin becomes highly branched and crosslinked, thermoplastic polymer chains start forming domains as driven by thermodynamic principles as the reaction proceeds substantially to completion.

At the end of the reaction, these domains have grown into phases of microscopic sizes (angstroms to microns) rich in thermoplastic polymer surrounded by a highly crosslinked matrix of the halogen-containing thermoset resin network.

Useful features which have been designed into the aforementioned system include:

1. The bromine-containing homo- or multicomponent thermoplastic polymer, which optionally contains an additional halogen component, preferably fluorine, is soluble in the thermosetting resin at a temperature of approximately 20° C. above the melting point of the resin. This polymer is referred to hereinafter as "the homo- or multicomponent thermoplastic polymer." This homo- or multicomponent thermoplastic polymer undergoes an in-situ phase separation process during network formation to form a microphase separated multiphase network. To achieve these criteria the backbone structure of the homo- or multicomponent thermoplastic modifier is selected and designed with the intent of maximizing compatibility.

2. Methyl ethyl ketone solubility of the homo- or multicomponent thermoplastic polymer makes this a system which is compatible with industrial environmental requirements. This is essential so that this material can be processed with the existing technologies currently utilized in the fabrication of printed circuit boards. Typically, high $T_g$ thermoplastics of this type are only soluble in polar aprotic solvents or chlorinated solvents which are not environmentally acceptable.

3. The introduction of reactive functional groups on the terminal ends of the homo- or multicomponent thermoplastic polymer thermoplastic modifier is especially beneficial. This allows the homo- or multicomponent thermoplastic polymer to be chemically incorporated (covalently bonded) into the network structure. Chemical incorporation enhances the compatibility of the modifier and result in a more uniform morphology. It also insures that solvent resistance in the cured network is maintained.

4. Molecular weight control of the homo- or multicomponent thermoplastic polymer modifier is provided. The solubility, morphology, modulus, and fracture toughness of the modified bromine-containing thermosetting resins are a function of the molecular weight of the homo- or multicomponent thermoplastic polymer modifier. Typically, the optimum molecular weight is in the range of 5,000 to 21,000 g/mol. This molecular weight range is just above the critical molecular weight for entanglements of these polymers. If melt processability is desired, lower molecular weights (2,500 to 13,000 g/mol) may be required to reduce the melt viscosity.

5. Optimal composition of the brominated homo- or multicomponent thermoplastic polymer modifier in the halogen-containing thermosetting resin ranges between 5 to 40 weight/weight percent. The resulting properties such as fracture toughness, morphology, modulus, dielectric constant, etc. are all a function of chemical nature of the modifier which has been designed in this case to provide improved mechanical performance without sacrificing the desirable properties of the epoxy thermoset material.

A further embodiment of this invention is a thermoset material having enhanced fracture toughness to permit the fabrication of composites having high percentage loading of metal or inorganic particles. Incorporation of metal, inorganic particles, pigments or fillers often have a deleterious effect on the mechanical properties of a composite which generally comprises a thermoset binder. The fillers act as sites wherein stress is concentrated and increase the modulus which in turn decreases the fracture toughness. The use of a thermoplastic modified thermoset resin overcomes this deficiency.

Composite materials comprising the thermoplastic modified thermosetting resin and conducting metal particles, pigments or fillers are useful in fabricating conductive articles and/or adhesives. Examples of conductive metals useful in the present invention are copper, nickel, gold, platinum, palladium, zinc and others or alloys or mixtures thereof. Such composites are useful in making electrical contacts or interconnections in electronic device application, or for shielding and electrostatic discharge uses. Electrically conductive adhesives are another possible use for electrically conductive modified thermosetting resins. Higher conductivities are possible with the system since they allow greater loading without sacrificing mechanical properties.

Composite materials comprising the thermoplastic modified thermosetting resins and thermally conductive particles, pigments or fillers are useful in fabricating heat conductive articles and/or adhesives. Examples of thermally conductive fillers include boron nitride, zinc oxide, aluminum nitride and diamond.

Heat conductive composite materials are used for thermal management of electronic packaging, power supply systems, chip attachment, and heat sink attachment. Heat conductive materials are needed for removing resistive thermal energy or distributing the heat over a larger surface area to facilitate its transfer into the environment through air convention, or by contact with a liquid or a solid.

Future high performance or high density circuit packaging will operate at higher temperatures due to the increased density of integrated circuits and greater power which necessitates the use of enhanced heat conductive materials having improved glass transition temperatures and fracture toughness as provided by the thermoplastic modified thermoset material.

It has been determined that hollow glass spheres or silica sphere fillers can be used to reduce the dielectric constant of glass reinforced composites. For example, the hollow glass spheres or silica spheres can be usefully blended into a prepreg comprising a thermoplastic modified thermoset in the range of between about 25 and 65 volume percent, each of the spheres having a diameter in the range of between about 5–25 microns. A more complete discussion of prepregs and the effect of the incorporation of these spheres into the prepreg and with respect to the reduction of dielectric constant is found in IBM disclosure EN 989,020 the contents of which are hereby incorporated by reference herein.

With the increased use of surface mount and direct chip attach technologies, there is a need to have a dielectric material possessing a low coefficient of thermal expansion (CTE). Typical epoxy/glass cloth composites have CTE's in the range of 15–30 ppm/°C. depending on the resin content. Silicon has a CTE in the range of 3–5 ppm/°C.

It has been determined that the composition of the present invention impregnated into a reinforcing matrix of glass fabric, a woven or non-woven mat made of a material such as an aramid fiber or a metal film such as a copper/Invar/copper composite can successfully reduce the in-plane CTE.

One embodiment of the present invention is the use of the blend composition to form glass cloth reinforced dielectrics. For many years, glass cloth has been used to reduce the in-plane CTE in epoxy/glass cloth composites. The glass acts as a constraining layer, thus reducing the CTE of the ply. The most common glass cloth is E-glass. The drawback of E-glass has been its high dielectric constant. By using glass cloth, the dielectric constant of the ply is increased. Therefore, there is a need to use a combination of a low dielectric constant thermosetting resin and a lower dielectric constant woven-glass cloth.

DESCRIPTION OF THE INVENTION PREFERRED EMBODIMENTS

Figure 1:
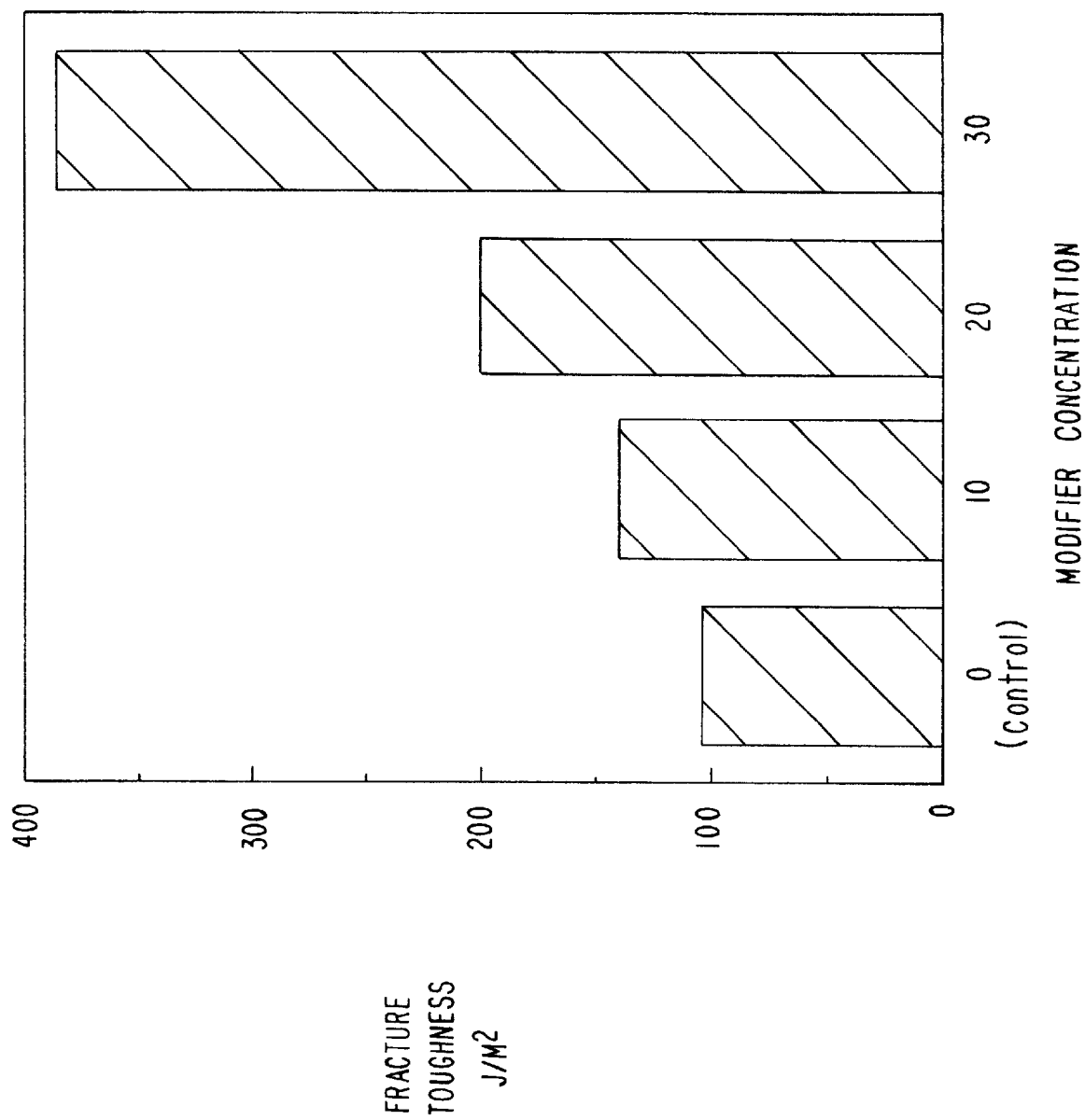
FIG. 1 is a plot of thermoplastic modifier concentration versus fracture toughness in a polycyanurate resin system.

The present invention relates to fluorine-containing thermosetting resins, in admixture with a fluorine-containing thermoplastic homopolymer which is soluble in the thermosetting resin. This fluorine-containing thermoplastic homopolymer undergoes an in-situ phase separation process during network formation to form a microphase separated multiphase thermoset material. Reactive functional groups on the fluorine-containing thermoplastic homopolymer modifier permit the modifier to be incorporated by covalent bonding into the polymer network structure.

The polymer networks in this case are based upon the reaction of thermosetting resins with a fluorine-containing thermoplastic homopolymer modifier such as is shown below:

bromine-containing homo- or multicomponent thermoplastic polymer which is soluble in the brominated thermosetting resin. This bromine-containing homo- or multicomponent thermoplastic polymer undergoes an in-situ phase separation process during network formation to form a microphase separated multiphase bromine-containing thermoset material. Reactive functional groups on the homo- or multicomponent thermoplastic polymer modifier permit the modifier to be incorporated by covalent bonding into the polymer network structure.

The polymer networks are based upon the reaction of halogen-containing thermosetting resins with a homo- or

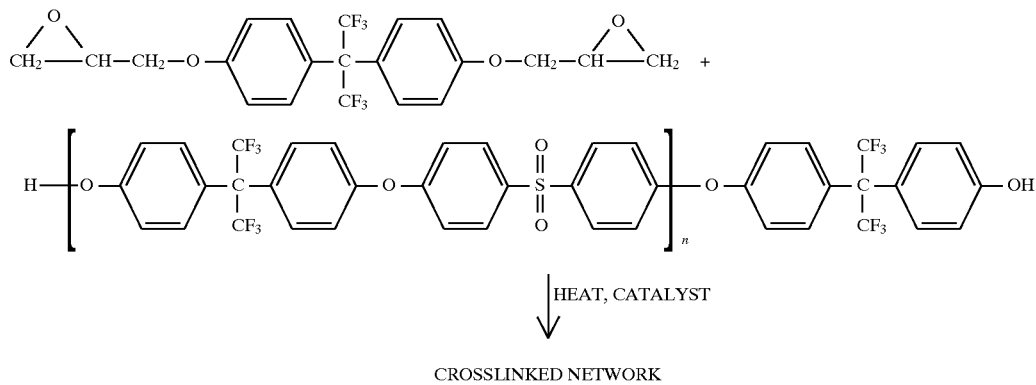

HEAT, CATALYST

CROSSLINKED NETWORK

Additionally, the present invention relates to containing thermosetting resins, in admixture with a fluorine-containing multicomponent thermoplastic polymer which is soluble in the resin. This multicomponent fluorine-containing thermoplastic polymer undergoes an in-situ phase separation process during network formation to form a microphase separated multiphase thermoset material. Reactive functional groups on the multicomponent fluorine-containing thermoplastic modifiers permit the modifier to be incorporated by covalent bonding into the polymer network structure.

The polymer networks in this case are based upon the reaction of thermosetting resins with a multicomponent fluorine-containing thermoplastic modifier such as is shown below:

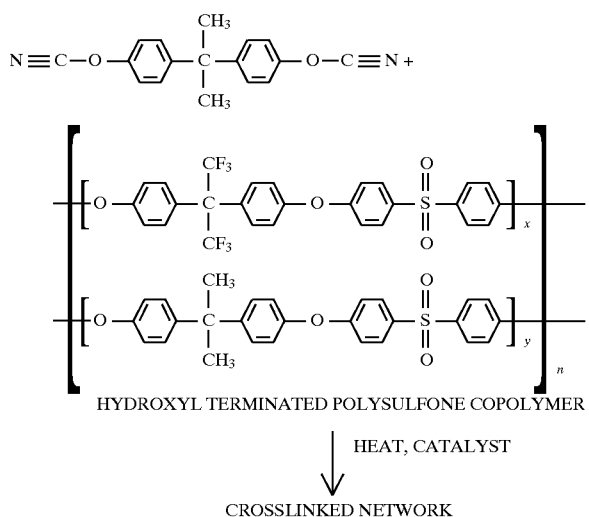

HYDROXYL TERMINATED POLYSULFONE COPOLYMER

HEAT, CATALYST

CROSSLINKED NETWORK

Additionally, the present invention relates to halogen-containing thermosetting resins, in admixture with a multicomponent thermoplastic polymer modifier such as is shown below:

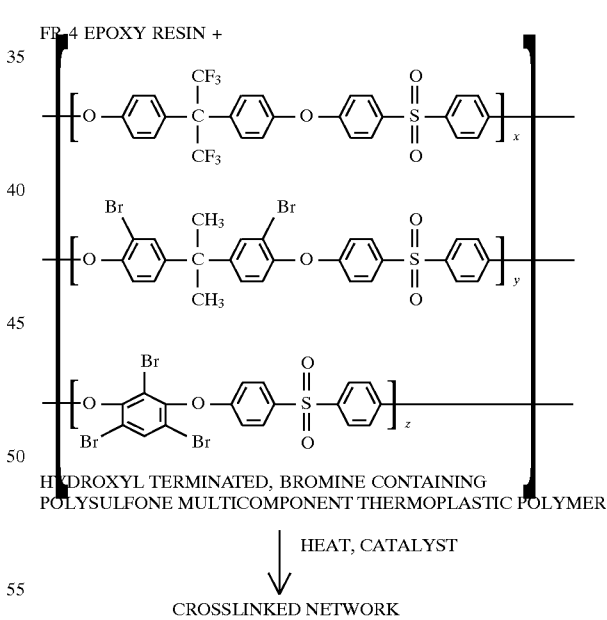

HYDROXYL TERMINATED, BROMINE CONTAINING POLYSULFONE MULTICOMPONENT THERMOPLASTIC POLYMER

HEAT, CATALYST

CROSSLINKED NETWORK

The thermoplastic polymer modifiers used in the present invention can be conveniently synthesized via nucleophilic aromatic substitution reactions. A poly(arlyene ether) is synthesized by reacing bisphenols with dihalides. In the course of the reaction, molecular weight and endgroup functionality are controlled by offsetting the stoichiometry in the reaction according to the Carrothers equation. An excess of the bisphenol reactant is utilized to achieve hydroxyl endgroups and an approximate number average molecular weight of about 15,000 g/mol.

A common way of reducing in-plane CTE of cured laminates is to solution impregnate or melt impregnate the thermoset resin into a woven glass cloth. The choice of the specific glass cloth will dictate the dielectric constant of the resulting composite structure. E-glass is the most commonly utilized cloth fabric, however, it has a dielectric constant of about 5.8.

Other glass cloths such as S-glass, D-glass, K-glass or Q-glass possess lower dielectric constants in the range of 3.2–3.4 and result in a cured laminate possessing a lower constant in comparison with E-glass.

The invention described here also involves solvent impregnation of a solution of the thermoplastic polymer modified thermosetting resin into aramid fibers. Both DuPont (tradename Thermount) and Teijin Ltd (tradename Technora) have developed chopped aramid fiber mats. A typical aramid fiber mat, suitable for use in the present invention is the mat made from co-poly-phenylene 3,4'oxdiphenylene terephthalamide referred to as"P-PODTA." The in-plane CTE of a mat such as a PPODTA mat (without resin) is on the order of −6 to −7 ppm/°C. ($10^6$ in/in/°C.). At a resin content of 50–60%, the in-plane CTE is in the range of 3–8 ppm/°C. This is very closely matched with the CTE of silicon and would not require the use of encapsulants to stabilize the chip during thermal cycling. To illustrate the benefits of the invention, the Er of the PPODTA paper is about 3.5. At 60 percent resin content the dielectric constant is about 2.8 to 3.5.

Another strategy for lowering the in-plane CTE of a composite is to use copper/Invar/copper as the constraining layer and also to serve as a power core. There are two approaches to fabricating this type of core. The first involves laminating a reinforced dielectric sheet, such as the S-glass, D-glass, or Q-glass dielectrics. The added benefit here is that the overall in-plane CTE's of both the Cu/Invar/Cu and the dielectric ply are low. Dielectric plies fabricated using the thermoplastic polymer modified thermosetting resin impregnated into the DuPont Thermount™ or Teijin Thechnora™ mat can also be utilized to fabricate a controlled CTE encapsulated power core structure.

An alternate method is to coat the Cu/Invar/Cu core using a continuous lamination process. The advantage of this method is that it is continuous and uses no solvents. Due to the unique compatibility of the thermoplastic polymer modifier in the thermosetting resin, the Cu/Invar/Cu core can be coated using a melt process.

Copper clad cores may be fabricated by placing multiple plies of prepreg between oxide treated copper foils and laminating under heat and pressure. Typically, the lamination process involves heating the copper foil and prepreg stack at between 5° to 10° C./min to the final platen set point. The platen set point is determined by the final $T_g$ of the matrix resin. To ensure full cure during the lamination process, the final temperature is set to be approximately 25° C. above the $T_g$ of the fully cured matrix. The pressure is typically in the range of 200–500 pounds per square inch, with the preferred pressure being 300 pounds per square inch. The thermoplastic polymer modified thermoset prepregs may be laminated at ambient pressures, or the preferred method is to use vacuum lamination. With vacuum lamination method, the environment in the vicinity of the prepreg/copper stack is evacuated to a pressure of 29.5 inches Hg using either a vacuum frame around the stack, or by enclosing the platens in a vacuum enclosure. The vacuum method is the preferred embodiment for making well-consolidated, void-free laminates.

An alternate method for fabricating copper clad cores is to use a continuous lamination process. There are two embodiments of this method; the first involves continuously laminating prepreg manufactured using standard impregnation towers between two sheets of a continuously moving roll of oxide treated copper foil. Heat and pressure are applied by a highly polished stainless steel belt on both sides of the laminate. Typical double belt laminators are available from either Simplekamp or Held Corporations. The preferred embodiment involves the production of copper clad cores using a melt impregnation of the moving web. This eliminates the need for producing prepreg on a large impregnation tower. In this embodiment, the resin is melted and applied to a roll of reinforcement (E-glass, K-glass, D-glass, S-glass, Technora™ paper, Thermount™ paper, by a doctor blade or slit die extrusion head. A thin film of molten resin is applied to a continuously moving oxide treated copper foil and is placed in contact with the moving web of the reinforcement. Molten resin may be applied to the top surface of the moving reinforcement or applied to a second roll of oxide treated copper foil. Prior to entering the double belt portion, the two copper foils and the reinforcement materials are brought into contact. The molten resin is forced into the reinforcement in the consolidation zone of the double belt laminator with the further application of higher temperatures and pressure. The second method produces copper clad cores of high quality in a continuous fashion without having to handle large volumes of volatile solvents.

Another application utilizes the thermoplastic polymer modified thermosetting resin impregnated into an expanded polytetrafluoroethylene (PTFE) reinforcement. Due to the problems drilling woven expanded PTFE fibers, a new expanded PTFE mat was developed. Using a satisfactory process, a thermosetting resin is impregnated into the mat.

Another embodiment of the present invention is the use of the composition thereof in electronic circuit packages. The general structures and manufacturing processes for electronic packages are described in for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Rienhold, New York, N.Y. (1988), both of which are hereby incorporated herein by reference.

The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Handbook*, pages 853–922, also previously incorporated herein by reference.

Articles can be used in electronic circuit packages prepared having a plurality of layers wherein at least one of the layers is formed of a curable material comprising a thermosetting resin and a thermoplastic polymer material which is cured. One or more of the remaining layers is formed of a thermoplastic or thermosetting resin, the particular resin to be selected based upon the desired properties to be utilized. To function efficiently as an electronic circuit package, the article described above contains electrically conductive metal patterns embedded therein which serve as a carrier for an electric circuit. Further discussion of electronic circuit packages is found in U.S. Pat. No. 5,103,293 to Bonafino et al., the contents of which are hereby incorporated by reference herein.

The articles formed are generally multilayer articles consisting of from two to fourteen layers comprising an electrically fluorinated conductive circuit layer on a polymer, ceramic or multilayer substrate wherein the thermoset material of the present invention is applied over the electrically conductive circuit layer from a solvent solution or from a melt solution to provide a dielectric layer having a planarized outer surface after curing said thermoset material, said article being characterized in having one set or a plurality of alternating wiring networks in said thermoset material.

The other thermoplastic or thermosetting layers comprising the article can be the same or different and are selected from the group consisting of polyimide, photosensitive polyimide, epoxy, benzocyclobutene or polycyanurate formed from photosensitive thermosetting resin.

EXAMPLE 1

Thermoplastic Modifier Synthesis-Bisphenol AF Polysulfone

To a 5 liter 4 neck round bottom flask equipped with a nitrogen inlet, thermometer, stirrer, and Dean Stark trap fitted with a condenser were charged 437.11 g 2,2'-bis(4-hydroxyphenol)hexafluoropropane, 319.34 g difluorodiphenylsulfone, 225 g potassium carbonate, 1775 ml N-methyl-2-pyrrolidinone and 775 ml toluene. The stoichiometry of the reactants was varied according to the Carothers equation to achieve hydroxyl-terminated oligomers of controlled molecular weight. The reaction contents were placed under nitrogen and heated until the toluene began to reflux at approximately 140°–155° C. The reaction mixtures was refluxed until complete dehydration was achieved (approximately 4 hours). The water released during phenoxide formation was collected and removed from the Dean Stark trap. Toluene was drawn from the Dean Stark trap until the reaction temperature reached 165°–170° C. The system was allowed to react for 10–12 hours, resulting in a viscous dark green solution. After cooling to approximately 80° C., the reaction mixture was filtered to remove inorganic salts. The reaction solution was then acidified to a pH of less than 7 with glacial acetic acid and precipitated into a 10 fold volume of methanol and water in a ratio of 25/75 (vol/vol), respectively. The precipitated oligomer (light tan powder) obtained by filtration was washed with methanol and was then dried under vacuum at 100°–200° C. After drying the oligomer was redissolved in tetrahydrofuran (30% solids concentration) and the precipitation, filtration and washing procedures were repeated. Finally, the precipitate was dried at 120° C. to constant weight yielding approximately 700 g of an oligomer possessing a molecular weight ($<Mn>$) of approximately 17,900 by size exclusion chromatography (GPC) and approximately 17,600 using a titration method with tetramethylammonium hydroxide in methanol. The oligomer possessed a glass transition temperature of 195° C.

EXAMPLE 2

Preparation of Toughened Fluorine-Containing Epoxy Resin Thermoset Materials To a 100 ml two-neck round bottom flask equipped with a gas inlet and mechanical stirrer is charged 31.5 g DGEBAF (diglycidylether of bisphenol-AF) and 13.5 g bisphenol AF polysulfone (30 wt./wt. percent). The mixture is heated to 120° C. with stirring and vacuum for degassing. In approximately 0.5–1.5 hours, the mixture is homo-genous and transparent. At this point, the mixture is poured into a preheated RTV silicone rubber mold containing shapes appropriate for mechanical property evaluation. Once filled, the mold is covered with a sheet of 0.01 mil teflon and is weighted down with a 0.25 inch thick piece of aluminum. The mold is placed into a forced-air convection oven and is cured under nitrogen at 190° C. for 2 hours and at 240° C. for an additional hour.

EXAMPLE 3

Preparation of E-Glass Prepreg/Laminates/Circuit Boards

A resin solution is prepared in a 2 liter beaker by mixing 765 g of DGEBAF (diglycidylether of bisphenol AF) with 600 g of methyl ethyl ketone. After thorough mixing, 135 g of bisphenol AF polysulfone (15 wt./wt. percent) is added and stirred mechanically until complete dissolution. The resulting varnish is crystal clear, amber colored liquid, indicating complete dissolution of all components in the methyl ethyl ketone. Approximately, one hour prior to use, the above-mentioned resin solution is catalyzed with about 0.2 phr 2-methylimidazole. The resin solution is impregnated into a 106 style, E-glass and K-glass reinforcing fabric using an impregnation treater tower. The resulting prepreg is heat treated at 140° C. for approximately 4 minutes to remove the methyl ethyl ketone solvent and to "B-stage" the resin. Laminates and circuit boards are fabricated by superimposing several layers of the prepreg and curing them at approximately 250° C. under approximately 300 psi of pressure for two hours.

EXAMPLE 4

Thermoplastic Modifier Synthesis-Fluorine Containing Polysulfone Copolymer

To a 2 liter 4 neck round bottom flask equipped with a nitrogen inlet, thermometer, stirrer, and Dean Stark trap fitted with a condenser were charged 30.246 g 4,4'-isopropylidenediphenol, 133.654 g 2,2'-bis(4-hydroxyphenol) hexafluoropropane, 130.130 g difluorodiphenylsulfone, 105 g potassium carbonate, 700 ml N-methyl-2-pyrrolidinone and 35 ml toluene. The stoichiometry of the reactants was varied according to the Carothers equation to achieve hydroxyl-terminated oligomers of controlled molecular weight. The reaction contents were placed under nitrogen and heated until the toluene began to reflux at approximately 140°–155° C. The reaction mixture was refluxed until complete dehydration was achieved (approximately 4 hours). The water released during phenoxide formation was collected and removed from the Dean Stark trap. Toluene was drawn from the Dean Stark trap until the reaction temperature reached 165°–170° C. The system was allowed to react for 10–12 hours, resulting in a viscous dark green solution. After cooling to approximately 80° C., the reaction mixture was filtered to remove inorganic salts. The reaction solution was then acidified to a pH of less than 7 with glacial acetic acid and precipitated into a 10 fold volume of methanol and water in a ratio of 25/75 (vol/vol), respectively. The precipitated oligomer (light tan powder) obtained by filtration was washed with methanol and was then dried under vacuum at 100°–120° C. After drying the oligomer was redissolved in tetrahydrofuran (30% solids concentration) and the precipitation, filtration and washing procedures were repeated. Finally, the precipitate was dried at 120° C. to constant weight.

EXAMPLE 5

Preparation of Toughened Polycyanurate Thermoset Materials

To a 100 ml two neck round bottom flask equipped with a gas inlet and mechanical stirrer was charged 31.5 g of a bisphenol-A dicyanate resin (Arocy B-10™ from Ciba) and 13.5 g of the polysulfone copolymer described in Example 4. The mixture was heated to 120° C. with stirring and vacuum for degassing. In approximately 0.5–1.5 hours, the mixture was homo-geneous and transparent. At this point, the mixture was poured into a preheated RTV silicone rubber mold containing shapes appropriate for mechanical property evaluation. Once filled, the mold was covered with a sheet of 0.01 mil Teflon and was weighted down with a 0.25 inch thick piece of aluminum. The mold was placed into a forced-air convection oven and was cured under nitrogen at 175° C. for 1 hour, 250° C. for 1 hour and 310° C. for 45 minutes.

The neat resin fracture toughness properties of the cured thermoset materials were evaluated according to the ASTM E399 standard test procedure. Fracture toughness results as a function of modifier concentration are shown in FIG. 1. From FIG. 1, it can be observed that a substantial increase in fracture toughness was achieved with increasing thermoplastic modifier concentration. In fact, at 30% (wt./wt.) a greater than 3.5 fold enhancement was achieved. Furthermore, the flexural modulus in the toughened thermosets (as evaluated by ASTM E966) was only reduced slightly; the modulus of the control material with no modifier was 3.0 GPa and the value obtained for 10% and 20% (wt./wt.) was 2.95–2.9 GPa.

EXAMPLE 6

Preparation of E-Glass Prepreg/Laminates/Circuit Boards

A resin solution was prepared in a 2 liter beaker by mixing 997 g of AroCy B-40s™ cyanate ester resin prepolymer solution (75% solids concentration in MEK) with 471 g methyl ethyl ketone. After thorough mixing, 132 g of the fluorine-containing polysulfone copolymer described in Example 4 was added and stirred mechanically until complete dissolution. The resulting varnish was crystal clear, amber colored liquid, indicating complete dissolution of all components in the methyl ethyl ketone. Approximately, one hour prior to use, the above-mentioned resin solution was catalyzed with 100 ppm manganese octanoate (12.5 g of a 0.0006 solution in MEK) and 1 phr of bisphenol-A. The resin solution was impregnated into E-glass reinforcing fabric using an impregnation treater tower. The resulting prepreg was heat treated at 160° C. for 4 minutes to remove MEK and "B-stage" the resin. Laminates and circuit boards were fabricated by superimposing several layers of the prepreg and curing them at 175° C. for 1 hour, 250° C. for 1 hour and at 310° C. for 45 minutes.

Various properties of cured E-glass laminates were evaluated and the results are shown in Table 1. From Table 2, it can be observed that the thermoplastic toughened polycyanurate thermosets possessed greatly enhanced copper peel and interlaminate bond strengths over unmodified polycyanurate materials. This suggests that the improved fracture toughness properties in the neat resins translates well into composite structures (i.e, laminates, circuit boards, etc.).

Figure 2:
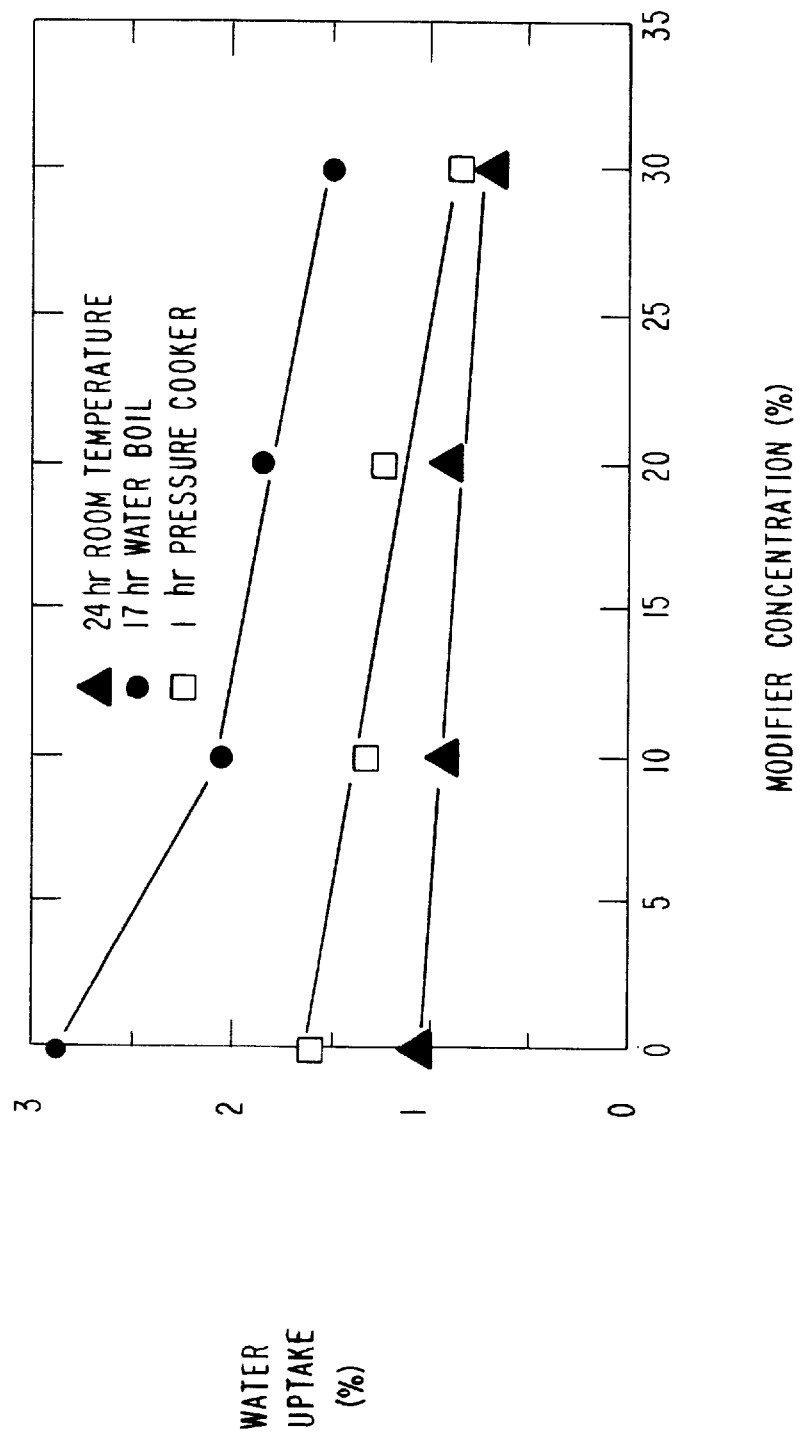
FIG. 2 is a plot demonstrating the influence of increasing thermoplastic modifier concentration on the moisture absorption properties of polycyannurate resins.

Moisture absorption as a function of thermoplastic modifier concentration was also evaluated and the results are shown in FIG. 2. As can be observed from FIG. 2, water uptake decreases significantly with increasing thermoplastic modifier concentration. This result is very desirable especially in electronic applications wherein water absorption is detrimental to dielectric performance.

TABLE 1

| Property* | Polycyanurate | Toughened Polycyanurate |
|---|---|---|
| Copper Peel Strength **(lbs/in) | 8–9 | 10–11 |
| Interlaminate Bond Strength (lbs/in) | 6 | 9–10 |
| Dielectric Constant | 3.7 | 3.7 |
| Glass Transition Temp. (°C.) | 295 | 295 |

*All properties based on E-glass laminates
**Test performed with 1 oz. Gould Copper Foil, 90 peel test

EXAMPLE 7

Thermoplastic Modifier Synthesis: Brominated Polysulfone Terpolymer

To a 2 liter 4 neck round bottom flask equipped with a nitrogen inlet, thermometer, stirrer, and Dean Stark trap fitted with a condenser were charged 39.262 g 4,4'-isopropylidenediphenol (Bis-A), 72.291 g 2,2'-bis(4-hydroxyphenol) hexafluoropropane (Bis-AF), 4.735 g resorcinol, 104.154 g difluorodiphenylsulfone (DFDPS), 83 g potassium carbonate, 675 ml N-methyl-2-pyrrolidinone, and 235 ml toluene. The stoichiometry of the reactants was varied according to the Carothers equation to achieve hydroxyl-terminated oligomers of controlled molecular weight. The reaction contents were placed under nitrogen and heated until toluene began to reflux at approximately 140°–155° C. The reaction mixture was refluxed until complete dehydration was achieved (approximately 4 hours). The water released during phenoxide formation was collected and removed from the Dean Stark trap. Toluene was drawn from the Dean Stark trap until the reaction temperature reached 165°–170° C.

The system was allowed to react for 10–12 hours, resulting in a viscous dark green solution. After cooling to approximately 80° C., the reaction mixture was filtered to remove inorganic salts. The reaction solution was then acidified to a pH of less than 7 with glacial acetic acid and precipitated into a 10 fold volume of methanol and water in a ratio of 25/75 (vol/vol), respectively. The precipitated oligomer (light tan powder) obtained by filtration was washed with methanol and was then dried under vacuum at 100°–120° C. After drying the oligomer was redissolved in tetrahydrofuran (30% solids concentration) and the precipitation, filtration and washing procedures were repeated. Finally, the precipitate was dried at 120° C. to constant weight.

The polysulfone (PSF) oligomer was brominated in a second reaction step. The polysulfone (75 g/0.155 mol) was charged into a 500 ml 3 neck round bottom flask equipped with a mechanical stirrer, gas inlet and additional funnel. Dichloroethane (175 ml) was added with stirring. The PSF/dichloroethane solution was cooled to 0°–5° C. with an ice water bath and 40.9 g (0.256 mol) of bromine dissolved in approximately 25 ml of dichloroethane was slowly added through the addition funnel under nitrogen. After the addition of the bromine/dichloroethane solution the ice bath was removed but the reacting temperature was monitored to assure that the temperature did not exceed 25° C. After reaching a temperature of 20°–25° C. the reaction was allowed to proceed for 10 hours. A base was added to neutralize the hydrobromic acid formed during the reaction, prior to precipitation into a 10 fold excess of methanol. The polymer was isolated by filtration and washed 3 times with methanol to yield a white polymer. The polymer was dried in a vacuum oven at 120° C. to constant weight.

Various co- and terpolymer compositions were synthesized by varying the Bis-AF, Bis-A and resorcinol molar ratios while holding the DFDPS concentration constant to yield polymers with target number average molecular weights of 15,000 g/mol. The polymers were brominated, as described above, and their compatibility with FR-4 epoxy (Ciba 8212 resin) was evaluated in cured samples prepared as described in the following example, Example 8. Compatible materials were defined as those possessing micron or submicron phase separation as evaluated by scanning electron microscopy. Partially compatible materials were defined as those possessing phase separation on a scale of greater than 10 microns but less than 20 microns. And incompatible polymers demonstrated gross phase separation (i.e., phase separation on a scale grater than 20 microns). Table 2 demonstrates the results achieved for a series of co- and terpolymer thermoplastic modifiers incorporated into FR-4 epoxy resin at 15 wt./wt. percent.

TABLE 2

| Polymer Composition (Mol %) | | | FR-4 Epoxy |
|---|---|---|---|
| Bis-AF | Bis-A | Resorcinol | Compatibility |
| 100 | 0 | 0 | Incompatible |
| 80 | 20 | 0 | Incompatible |
| 65 | 35 | 0 | Incompatible |
| 50 | 50 | 0 | Compatible |
| 35 | 65 | 0 | Partially Comp. |
| 25 | 75 | 0 | Partially Comp. |
| 0 | 100 | 0 | Partially Comp. |
| 50 | 40 | 10 | Compatible |
| 50 | 25 | 25 | Compatible |

EXAMPLE 8

Preparation of Toughened Bromine-Containing Epoxy Resin Thermoset Materials

To a 100 ml two-neck round bottom flask equipped with a gas inlet and mechanical stirrer was charged 31.5 g of FR-4 epoxy resin (Ciba 8212) and 13.5 g of the brominated terpolymer described in Example 7. The mixture was heated to 120° C. with stirring and vacuum for degassing. In approximately 0.5–1.5 hours, the mixture was homogeneous and transparent. At this point, the mixture was poured into a preheated RTV silicone rubber mold containing shapes appropriate for mechanical property evaluation. Once filled, the mold was covered with a sheet of 0.01 mil Teflon and was weighted down with a 0.25 inch thick piece of aluminum. The mold was placed into a forced-air convection oven and was cured under nitrogen at 177° C. for 2 hours.

Figure 3:
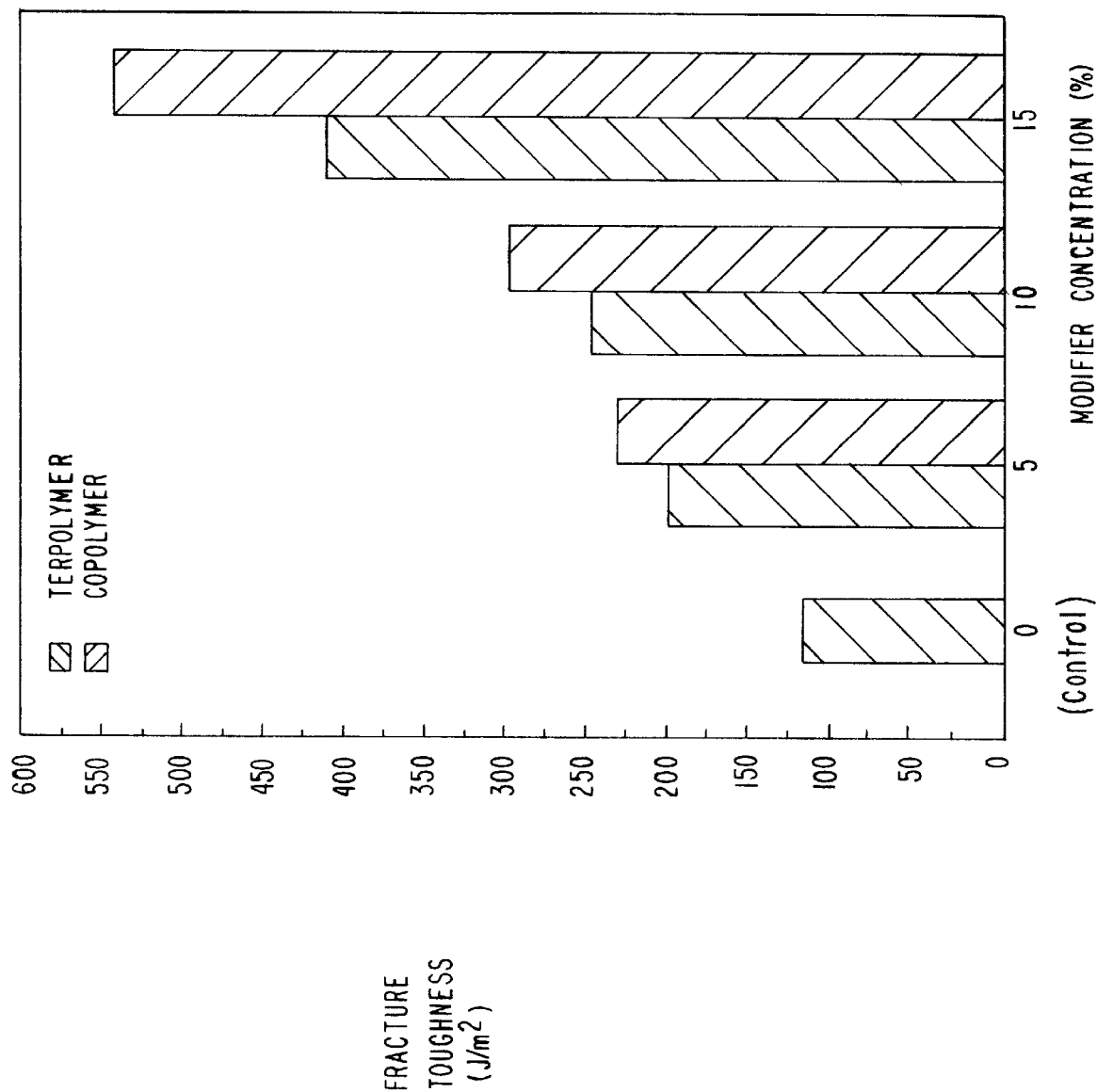
FIG. 3 is plot of thermoplastic modifier concentration versus fracture toughness for toughened FR-4 epoxy resin thermosets.

The neat resin fracture toughness properties of the cured thermoset materials were evaluated according to ASTM E399 standard test procedure. The results for two compatible thermoplastic polymer modifiers from Table 2 are shown in FIG. 3. FIG. 3 is a bar plot demonstrating the effect of increasing thermoplastic modifier concentration on the fracture toughness properties for a copolymer possessing 50 mol % Bis-AF and 50 mol % Bis-A and for a terpolymer possessing 50 mol % Bis-AF, 40 mol % Bis-A and 10 mol % resorcinol (both described in further detail in Example 7 and Table 2). From FIG. 3, it can be observed that a substantial increase in fracture toughness was achieved with increasing thermoplastic modifier concentration. Indeed, the toughness increased from 120 $J/m^2$ to 550 $J/m^2$ with 30% (wt./wt.) incorporation of the brominated copolymer modifier. Furthermore, the brominated copolymer was observed to be a more effective toughening agent than the brominated terpolymer.

EXAMPLE 9

Preparation of E-Glass Prepreg/Laminates/Circuit Boards

A resin solution was prepared in a 2 liter beaker by mixing 1127 g of FR-4 epoxy resin (Ciba 8212 in MEK-70% solids concentration) with 334 g methyl ethyl ketone. After thorough mixing, 139 g of the brominated polysulfone terpolymer described in Example 7 was added and stirred mechanically until complete dissolution. The resulting varnish was crystal clear, amber colored liquid, indicating complete dissolution of ail components in the methyl ethyl ketone. Approximately, one hour prior to use, the above-mentioned resin solution was catalyzed with about 0.2 phr 2-methylimidazole. The resin solution was impregnated into E-glass reinforcing fabric using an impregnation treater tower. The resulting prepreg was heat treated at 140° C. for approximately 4 minutes to remove the methyl ethyl ketone solvent and to "B-stage" the resin. Laminates and circuit boards were fabricated by superimposing several layers of the prepreg and curing them at approximately 177° C. under approximately 300 psi of pressure for two hours.

Various properties of cured E-glass laminates were evaluated and the results are shown in Table 3. From Table 3, it can be observed that the toughened FR-4 epoxy resin thermosets, exhibiting a 3 to 5 fold enhancement in neat resin toughness as observed from FIG. 3, retain their desirable laminate properties when compared to an unmodified FR-4 epoxy resin thermoset. In fact, a slight reduction in moisture absorption was observed in the toughened material which is very desirable.

TABLE 3

| Property* | FR-4 Resin | Toughened FR-4 Resin |
|---|---|---|
| Copper Peel Strength **(lbs/in) | 8–10 | 8–10 |
| Interlaminate Bond Strength (lbs/in) | 6 | 6–7 |
| Dielectric Constant | 3.9–4.2 | 3.9–4.2 |
| Moisture Absorption (%) | | |
| 24 HR Room Temperature | 0.24 | 0.20 |
| 16 HR Water Boil | 0.72 | 0.64 |
| 1 HR Pressure Cooker | 0.41 | 0.36 |
| Glass Transition Temperature (°C.) | 170 | 170 |
| Coefficient of Thermal Expansion (ppm/°C.) | | |
| X–Y (Below $T_g$) | 19 | 19 |
| Z (Below $T_g$) | 76 | 76 |
| Z (Above $T_g$) | 320 | 320 |

*All properties based on E-glass laminates
**Test performed with 1 oz. Gould copper foil, 90 peel test test

What we claim and desire to protect by Letters Patent is:
1. A curable material consisting of:
the reaction product of a fluorine-containing thermoset material selected from one or more of the following resins epoxy, bismaleimides, acetylene terminated resins, bisnadimides, benzocyclobutenes, and bismaleimide triazine-epoxy resin blend, with a fluorine-containing arylene ether homopolymer;

said reaction product being heat-curable at temperatures of between about 100° C. to 325° C.;

said reaction product in the cured state comprising said fluorine-containing thermoset material having a plurality of discrete phases of said fluorine-containing arylene ether homopolymer dispersed therein;

said arylene ether homopolymer phases being in the range of submicron to micron size.

2. The material in the cured state defined in claim 1 which has a toughness of greater than about 100 Joules per square meter.

3. The curable material defined in claim 1 wherein said fluorine-containing thermoplastic homopolymer has the repeating structural element of formula (I):

$$X+O-R_2-O-R_1\frac{}{n}X \qquad (I)$$

wherein X is any group capable of reacting with an amine, epoxide, nadimide, maleimide, acetylene, propargyl, benzocyclobutene; and n is 1 to 100;

wherein $R_1$ represents bivalent aromatic groups of the formulas (IIa)–(IIe)

wherein Y represents —CO—, —SO—, —S— or —SO$_2$—, —PO(C$_6$H$_5$)—, p signifies the number 0, 1 or 2 and q is the number 2 or 3, $R_2$ signifies a bivalent aromatic group of the formulas (IIIa)–(IIIr)

-continued

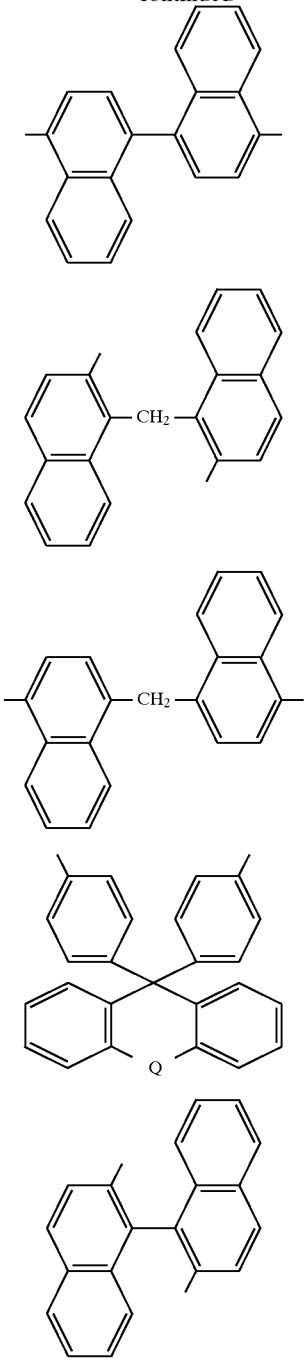

(IIIn)

(IIIo)

(IIIp)

(IIIq)

(IIIr)

wherein Q represents a direct bond, —CH₂—, —O— or —CO—, and wherein Z represents —CH₂—, C(CH₃)₂—, —C(CH₃)(C₆H₅)—, —CH(CH₃)—, —C(CF₃)(C₆H₅), —C(CF₃)₂—, —PO(C₆H₅)—, —S—, —O—, —SO—, —SO₂— or —CO—, wherein the aromatic rings of the formulas (IIa)–(IIe) are unsubstituted or are substituted by one or more halogen atoms and/or (C₁–C₅) alkyl groups which may be fluorine-containing or (C₁–C₅) alkoxy groups which may be fluorine-containing and wherein the aromatic rings of the formulas (IIIa)–(IIIr) are unsubstituted or are substituted by one or more halogen atoms and/or (C₁–C₅) alkyl groups or (C₁–C₅) alkoxy groups which may contain fluorine; and wherein either R₁ or R₂ must contain fluorine.

4. Compositions according to claim 3, wherein formula (I) R₁ represents

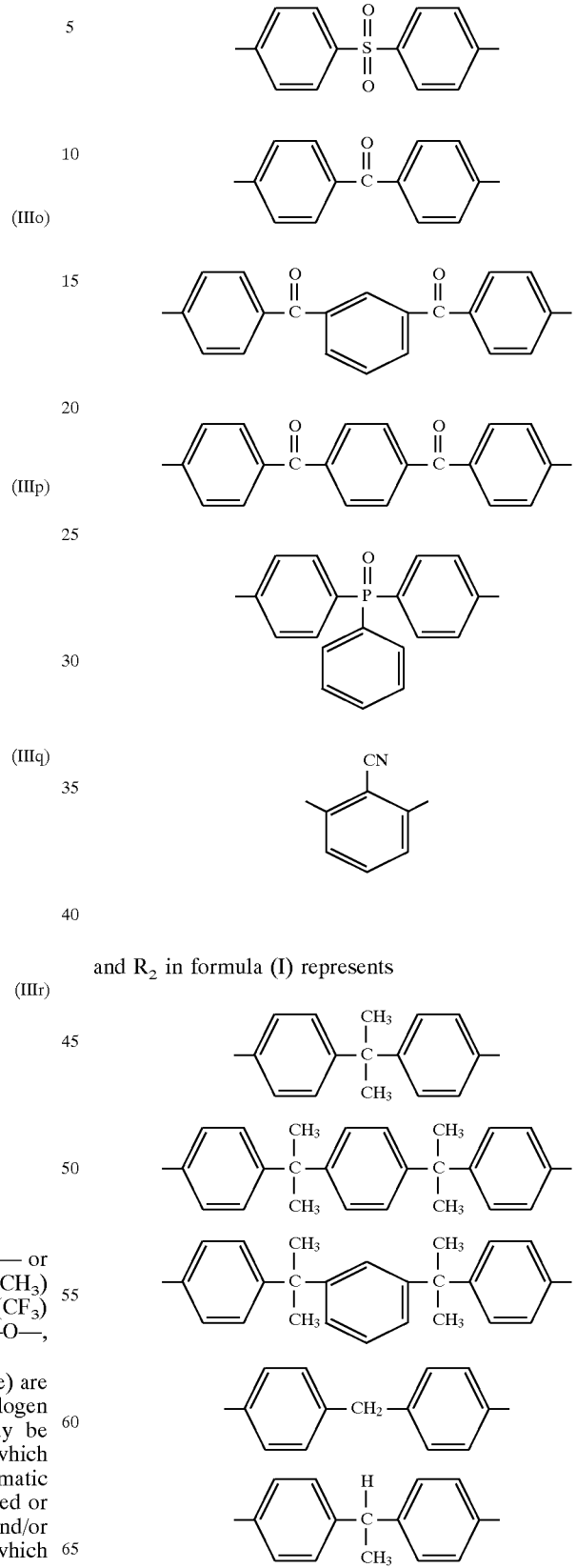

and R₂ in formula (I) represents

-continued

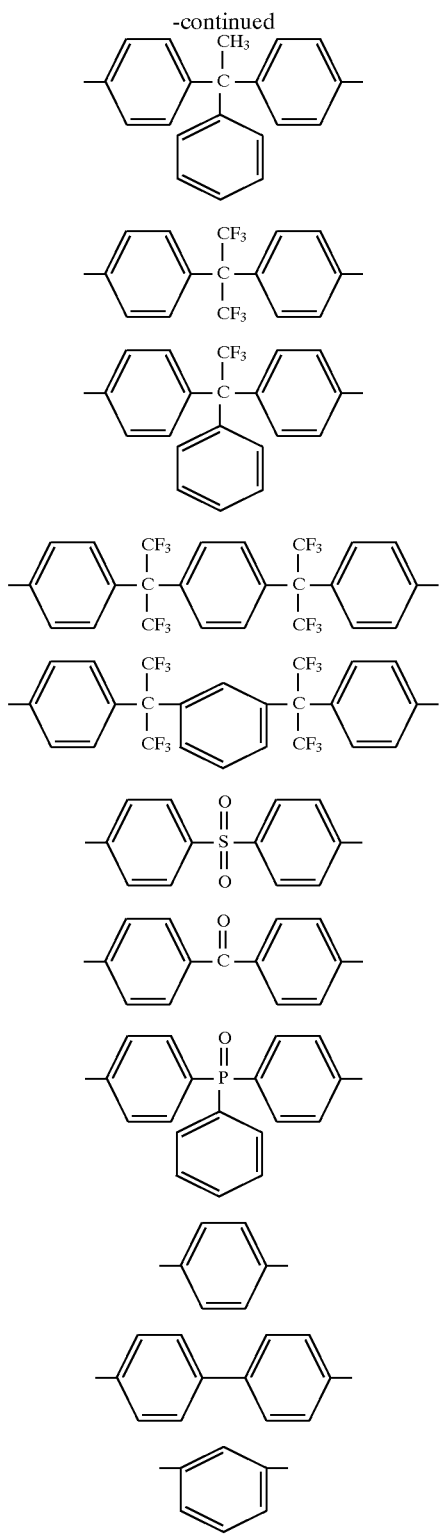

wherein the aromatic rings are unsubstituted or are substituted by one or more halogen atoms and/or (C$_1$–C$_5$) alkyl groups which may contain fluorine or (C$_1$–C$_5$) alkoxy groups which may contain fluorine.

5. The thermoplastic homopolymer defined in claim 3 wherein X is a hydroxyl group.

6. The curable material defined in claim 3, wherein said fluorine-containing thermoplastic homopolymer has a molecular weight in the range of 2,500 to 30,000 g/mol number average molecular weight.

7. The curable material defined in claim 3 wherein said fluorine-containing thermoplastic homopolymer is present in the range of between about 5 and 50 weight/weight percent.

8. The curable material defined in claim 3 wherein said fluorine-containing thermoplastic homopolymer is present in the range of between about 10 and 20 weight/weight percent.

9. A prepreg which is heat curable within a temperature range of between about 100° C. and 325° C. comprising a reinforcing material impregnated with said curable material defined in claim 3.

10. A blend capable of forming an electrically conductive composite comprising the curable material of claim 3 in admixture with electrically conductive particles selected from the group consisting of carbon, copper, nickel, silver, gold, platinum, palladium, iron, zinc, tungsten, molybdenum and alloys and mixtures thereof.

11. A blend capable of forming a thermally conductive composite comprising the curable material of claim 3 in admixture with heat conductive particles selected from the group consisting of aluminum oxide, aluminum nitride, boron nitride, zinc oxide, diamond and silica.

12. A blend comprising the curable material defined in claim 3 in admixture with between about 25 to about 65 volume percent hollow glass spheres or silica spheres each said sphere having a diameter within the range of between about 5 to 25 microns.

13. Compositions according to claim 3, wherein in the formula (I), R$_1$ represents

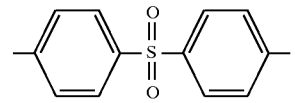

and R$_2$ represents

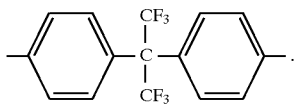

14. The curable material of claim 13, wherein said material is fully soluble in methyl ethyl ketone.

15. The curable material defined in claim 13 wherein said fluorine-containing thermoplastic homopolymer has a molecular weight in the range of 2,500 to 30,000 g/mol number average molecular weight.

16. The curable material defined in claim 13 wherein said fluorine-containing thermoplastic homopolymer is present in the range of between about 10 and 20 weight/weight percent.

17. A prepreg which is heat curable within a temperature range of between about 100° C. and 325° C. comprising a reinforcing material impregnated with said curable material defined in claim 13.

18. The prepreg defined in claim 17 wherein said reinforcing material is woven glass fabric.

19. The prepreg defined in claim 17 wherein said reinforcing material is a non-woven aramid fiber mat.

20. The prepreg defined in claim 17 wherein said reinforcing material is a mat of expanded polytetrafluoroethylene.

21. The prepreg defined in claim 17 wherein said reinforcing material is woven or unidirectional carbon fibers.

22. A blend comprising the prepreg defined in claim 17 in admixture with between about 25 to about 65 volume percent hollow glass or silica spheres, each said sphere having a diameter with the range of between about 5 to 25 microns.

23. The prepreg defined in claim 9 wherein said reinforcing material is woven glass fabric.

24. The prepreg defined in claim 23 wherein said woven glass fabric is E-glass.

25. A blend comprising the prepreg defined in claim 23 in admixture with between about 25 to about 65 volume percent hollow glass or silica spheres, each said sphere having a diameter with the range of between about 5 to 25 microns.

26. The prepreg defined in claim 9 wherein said reinforcing material is a non-woven aramid fiber mat.

27. The prepreg defined in claim 9 wherein said reinforcing material is a mat of expanded polytetrafluoroethylene.

28. The prepreg defined in claim 9 wherein said reinforcing material is woven or unidirectional carbon fibers.

29. A blend capable of forming an electrically conductive composite comprising said prepreg defined in claim 9 in admixture with electrically conductive particles selected from the group consisting of carbon, copper, nickel, silver, gold, platinum, palladium, iron, zinc, tungsten, molybdenum and alloys and mixture thereof.

30. A blend capable of forming a thermally conductive composite comprising the prepreg defined in claim 9 in admixture with thermally conductive particles selected from the group consisting of aluminum oxide, aluminum nitride, boron nitride, zinc oxide, diamond and silica.

31. A blend comprising the prepreg defined in claim 9 in admixture with between about 25 to about 65 volume percent hollow glass or silica spheres, each said sphere having a diameter within the range of between about 5 to 25 microns.

32. The curable material of claim 1 that contains a catalyst to accelerate the cure of said uncured material.

33. The curable material defined in claim 1, wherein said fluorine-containing thermoplastic homopolymer is soluble in both methyl ethyl ketone and said thermoset prior to cure.

34. The curable material defined in claim 1, wherein said fluorine-containing thermoplastic homopolymer has a glass transition temperature of at least 130° C.

* * * * *